United States Patent
Lal et al.

(10) Patent No.: US 12,051,474 B2
(45) Date of Patent: Jul. 30, 2024

(54) RESISTIVE ELECTRODES ON FERROELECTRIC DEVICES FOR LINEAR PIEZOELECTRIC PROGRAMMING

(71) Applicant: Cornell University, Ithaca, NY (US)

(72) Inventors: Amit Lal, Ithaca, NY (US); Shubham Jadhav, Ithaca, NY (US); Ved Gund, Ithaca, NY (US); Benyamin Davaji, Ithaca, NY (US); Grace Xing, Ithaca, NY (US); Debdeep Jena, Ithaca, NY (US)

(73) Assignee: Cornell University, Ithaca, NY (US)

( * ) Notice: Subject to any disclaimer, the term of this patent is extended or adjusted under 35 U.S.C. 154(b) by 164 days.

(21) Appl. No.: 17/821,789

(22) Filed: Aug. 23, 2022

(65) Prior Publication Data

US 2023/0054128 A1    Feb. 23, 2023

Related U.S. Application Data

(60) Provisional application No. 63/236,190, filed on Aug. 23, 2021.

(51) Int. Cl.
  *G11C 23/00*    (2006.01)
(52) U.S. Cl.
  CPC ................... *G11C 23/00* (2013.01)
(58) Field of Classification Search
  CPC ..... G11C 23/00; G11C 11/22; G11C 11/5657; G11C 11/2275; G11C 11/54; G06N 3/063
  See application file for complete search history.

(56) References Cited

U.S. PATENT DOCUMENTS

| | | |
|---|---|---|
| 6,353,550 B1 | 3/2002 | Hirano |
| 6,614,051 B1 | 9/2003 | Ma |
| 6,844,582 B2 | 1/2005 | Ueda et al. |
| 8,944,014 B2 | 3/2015 | Bhansali et al. |
| 11,150,873 B2 | 10/2021 | Berdan et al. |
| 11,164,976 B2 | 11/2021 | Ramamoorthy et al. |
| 11,232,824 B1 | 1/2022 | Gong et al. |
| 11,381,244 B1 | 7/2022 | Manipatruni et al. |
| 2017/0243875 A1 | 8/2017 | Khan |
| 2020/0202204 A1 | 6/2020 | Kouno et al. |

(Continued)

OTHER PUBLICATIONS

V. Pott, H. Kam, R. Nathanael, J. Jeon, E. Alon and T.-J. King Liu, "Mechanical Computing Redux: Relays for Integrated Circuit Applications," in Proceedings of the IEEE, vol. 98, No. 12, pp. 2076-2094, Dec. 2010 (Year: 2010).*

(Continued)

*Primary Examiner* — Ajay Ojha
(74) *Attorney, Agent, or Firm* — COZEN O'CONNOR

(57) ABSTRACT

Disclosed are ferroelectric devices including devices for performing a multiplication of analog input signals and resonators. In one aspect, a ferroelectric nanoelectromechanical device includes a first structural beam, a first input electrode disposed on a first top portion of the first structural beam, and an output electrode. The apparatus further includes a first ferroelectric film disposed on a second top portion of the first input electrode, and a first resistive layer disposed on a third top portion of the first ferroelectric film, wherein a first electrode is positioned at a first end of the first resistive layer and a second electrode is positioned at a second end of the first resistive layer.

22 Claims, 29 Drawing Sheets

(56) References Cited

U.S. PATENT DOCUMENTS

2021/0036024 A1* 2/2021 Kim ...................... H10B 51/30
2022/0019885 A1 1/2022 Jung et al.

OTHER PUBLICATIONS

Bian, Jihong et al., "Neuromorphic computing: Devices, hardware, and system application facilitated by two-dimensional materials," Applied Physics Reviews, Phys. Rev. 8, 041313 (2021); https://doi.org/10.1063/5.0067352, 25 pages.

* cited by examiner

| Technology | MAC energy | Note |
|---|---|---|
| GPU | 10-20pJ | Digital – FP |
| TPU | 1-5pJ | Digital – 8-bit |
| True North | 10-15pJ | Digital – 16 bit |
| EYERISS – integrated neural net | 10pJ | Digital – integrated with Camera |
| Holleman - Transistor | 1pJ | Analog – 1 TOP/W |
| Strukov - Transistor | 0.2pJ | Analog – number of bits limited |
| FerroNEMS | 1aJ to 1fJ | Analog |

1000

| | Feature | Design 1 | Design 2 |
|---|---|---|---|
| 1 | Structural Layer ($Si_3N_4$) thickness | 300nm | 100nm |
| 2 | Beam Length (L) | 50μm | 5μm |
| 3 | Beam Width (w) | 10μm | 1μm |
| 4 | Sc-AlN Length (l) | 20μm | 2μm |
| 5 | Sc-AlN thickness | 300nm | 100nm |

| | Properties | Details | n-doped PECVD PolySi [1] | p-doped LPCVD PolySi [2] | Nichrome [3] |
|---|---|---|---|---|---|
| 1 | Resistivity | $\rho$ | 5.80 Ω·m | 700e-6 Ω·m | 1e-6 Ω·m |
| 2 | thickness | t | 100 nm | 100 nm | 100 nm |
| 3 | Resistance<br>L=5μm, w=1μm<br>L=1μm, w=200nm | $R = \rho \dfrac{L}{w \times t}$ | 290 MΩ | 35 kΩ | 50 Ω |
| 4 | RC time constant<br>L=5μm, w=1μm<br>L=1μm, w=200nm | $\tau = RC$ | 1.67e-6 sec<br>66.7e-9 sec | 201e-12 sec<br>8e-12 sec | 288e-15 sec<br>11.5e-15 sec |

1030

| | Details | | L=5μm, w=1μm | L=1μm, w=200nm |
|---|---|---|---|---|
| 1 | Sc-AlN Capacitance ($\varepsilon_r = 13$) | $C = \dfrac{\varepsilon_r \varepsilon_0 L \times w}{t}$ | 5.75e-15 F | 0.23e-15 F |
| 2 | Electrical Energy consumed for<br>$V_{max} = 1.2 \times E_c t_p = 42V$ | $E_e = \dfrac{1}{2} C V_{max}^2$ | 5e-12 J | 0.2e-12 J |

FIG. 10B $$\frac{V_{out}}{2V_{dd}} \sim \frac{\frac{4\varepsilon_0 A}{kg^2}\sum w_i s_i}{2Ng} = \frac{2\varepsilon_0 A}{Nkg^3}\sum w_i s_i$$

- Computing scale ~ O(1) – speed limited by the NEMS resonance frequency
- In GPU/TPU – serial nature makes computation delay O(N) or higher

1200

1210 — Receiving a first voltage applied to a first input electrode disposed on a first top portion of a first structural beam, wherein a first ferroelectric film is disposed on a second top portion of the first input electrodes 1220 — Receiving a second voltage applied to a first electrode, wherein the first resistive layer is disposed on a third top portion of the first ferroelectric film 1230 — Generating an output voltage at an output electrode represented by a multiplication of the first voltage and the second voltage

FIG. 12

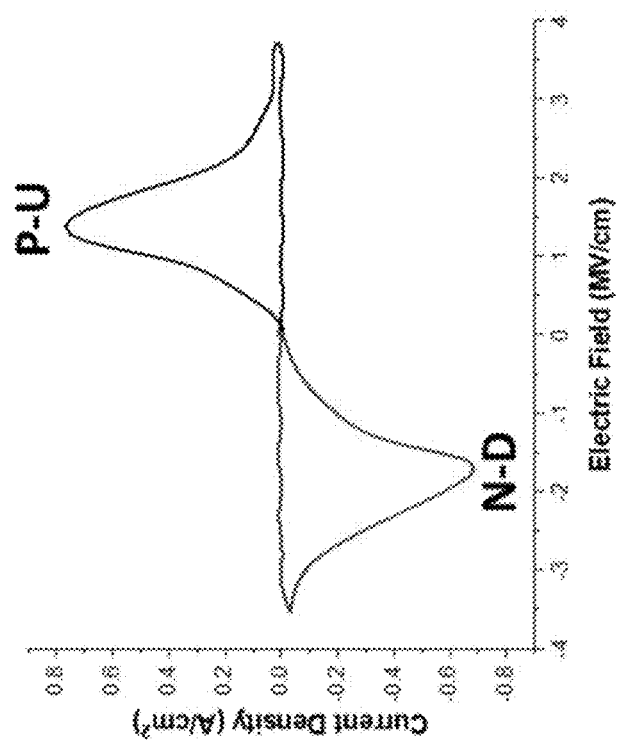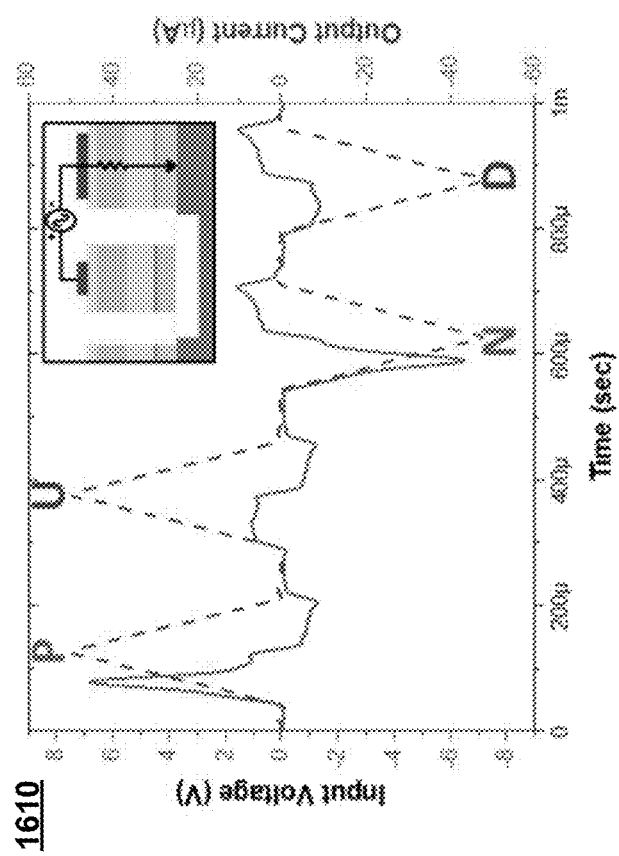
FIG. 16A

RESISTIVE ELECTRODES ON FERROELECTRIC DEVICES FOR LINEAR PIEZOELECTRIC PROGRAMMING

CROSS-REFERENCE TO RELATED APPLICATION

This application claims priority to U.S. Provisional Application No. 63/236,190, filed on Aug. 23, 2021, the disclosure of which is hereby incorporated by reference herein in its entirety.

STATEMENT REGARDING FEDERALLY SPONSORED RESEARCH

This invention was made with government support under contract HR0011-20-9-0048 awarded by the Defense Advanced Research Project Agency (DARPA). The government has certain rights in the invention.

TECHNICAL FIELD

The technology disclosed in this patent document relates ferroelectric and piezoelectric devices.

SUMMARY

Disclosed are example ferroelectric devices that can be used to multiply two analog quantities as well as tunable resonators. The functions and performance of these devices can be modified by adjusting the ferromagnetic domains at certain locations in the devices.

In one aspect, a ferroelectric nanoelectromechanical apparatus includes a first structural beam, a first input electrode disposed on a first top portion of the first structural beam, and an output electrode. The apparatus further includes a first ferroelectric film disposed on a second top portion of the first input electrode, and a first resistive layer disposed on a third top portion of the first ferroelectric film, wherein a first electrode is positioned at a first end of the first resistive layer and a second electrode is positioned at a second end of the first resistive layer.

In another one aspect, a ferroelectric apparatus includes a right and left structural beams, and right and left input electrodes disposed on first top portions of the right and left structural beams. The apparatus further includes an output electrode positioned between the right and left input electrodes, and right and left ferroelectric films disposed on second top portions of the right and left input electrodes. Right and left resistive layers are disposed on third top portions of the ferroelectric films, wherein a first electrode is positioned at a first end of each resistive layer and a second electrode is positioned at a second end of each resistive layer.

In yet another aspect, a method of multiplying voltages includes receiving a first voltage applied to a first input electrode disposed on a first top portion of a first structural beam, wherein a first ferroelectric film is disposed on a second top portion of the first input electrodes and receiving a second voltage applied to a first electrode, wherein the first resistive layer is disposed on a third top portion of the first ferroelectric film. The method further includes generating an output voltage at an output electrode represented by a multiplication of the first voltage and the second voltage.

In still another aspect, a method of multiplying voltages includes receiving a first voltage applied to a first right input electrode disposed on a top portion of a right structural beam and a first left input electrode disposed on a top portion of a left structural beam, wherein right and left ferroelectric films are disposed on second top portions of the right and left input electrodes. The method further includes receiving a second voltage applied to a right resistive layer electrode and a left resistive layer electrode, wherein the right and left resistive layers are disposed on third top portions of the right and left ferroelectric films. The method includes generating an output voltage at an output electrode represented by a multiplication of the first voltage and the second voltage.

Additional features are disclosed in the figures and claims.

BRIEF DESCRIPTION OF THE DRAWINGS

FIG. 10A shows a table comparing energy requirements for various technologies and some dimensions for illustrative devices;

FIG. 10B includes a table showing a comparison of some example gate material properties;

FIG. 12 shows an example of a process, in accordance with some example embodiments;

FIG. 16A shows example voltage and output current vs. time plot of an example device showing larger switching currents compared to leakage currents and switching current density vs. electric field plot showing ferroelectric switching peaks.

DETAILED DESCRIPTION

Figure 1:
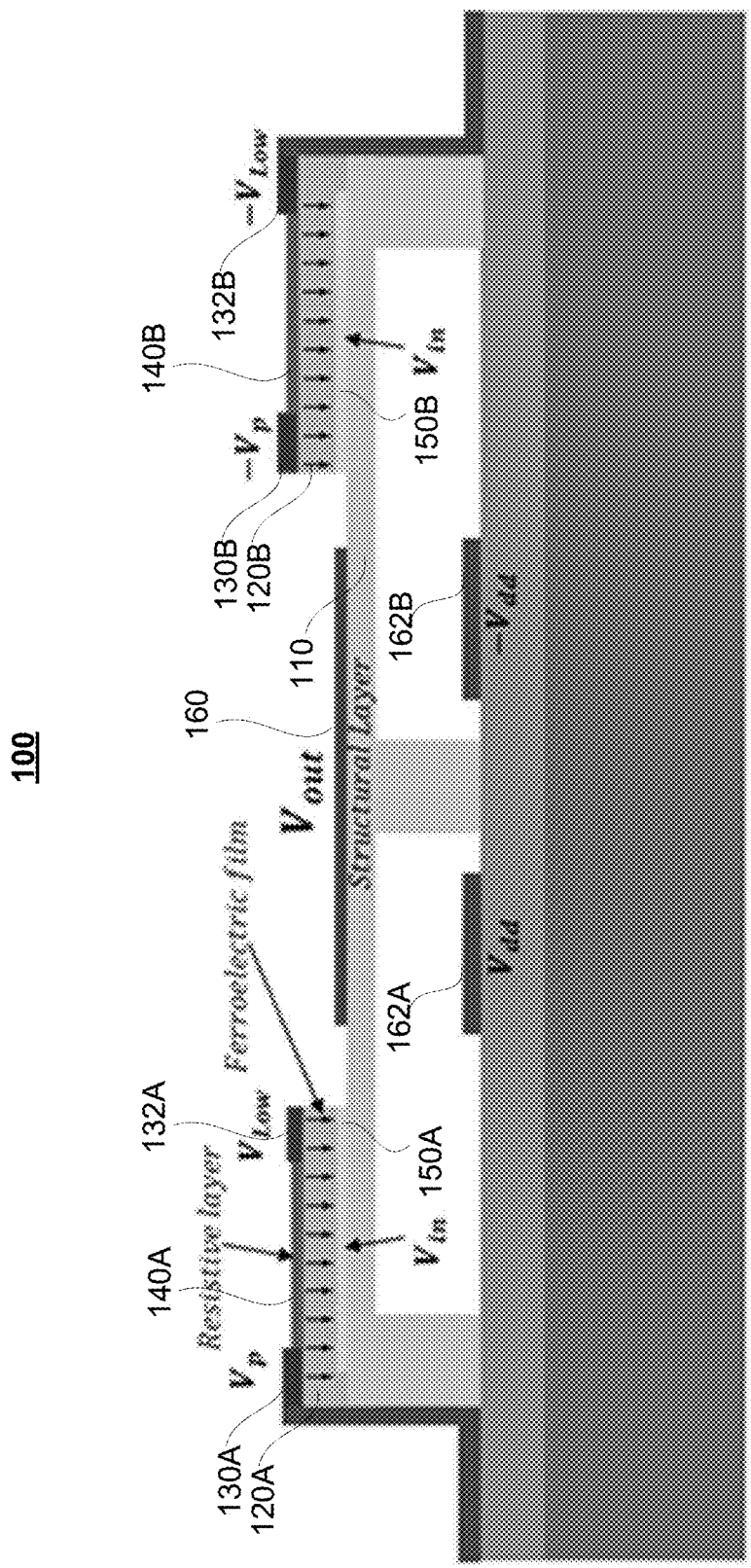
FIG. 1 depicts a schematic cross-sectional view of a device, in accordance with some example embodiments.

Disclosed is a resistive material used as an electrode on a programmable material such as a ferroelectric material. A resistive layer allows for a linear variation in the voltage along the resistive layer when different voltages are applied on a left and a right side of the resistive layer via electrodes (see, for example, FIG. 1). The device can include a beam 110 made of a structural layer such as silicon nitride, or aluminum nitride (aluminum nitride can also be used as a dielectric material or piezoelectric material). On top of this layer, a capacitor can be formed with a ferroelectric film 120A/B between top electrodes 130A/B and 132A/B and bottom electrodes 150A/B. The resistive layer includes electrodes, with a source and a drain electrode. A voltage applied across the resistive layer between 130A/B and 132A/B leads to a linear voltage variation. This linear change in voltage leads to a linear change in the electric field applied across the ferroelectric material 120A/B. Two electrodes, $V_{out}$ at 160 and 162A/B are used to capacitively measure the gap changes due to the motion induced by the ferroelectric capacitor when operated as a piezoelectric material. The ferroelectric/piezoelectric layer, the bottom structural layer, and the rest of the electrodes form a multilayer structure that undergoes a net moment when an electric field is applied across the ferroelectric/piezoelectric thin film. Although this patent document discloses use of ferroelectric layers (also referred to as ferroelectric films), other programmable layers can be used as well.

The disclosed structure performs a capacitive multiplication of two analog quantities where one quantity is stored as a mechanical stress/deformation state in a ferroelectric domain fraction. This architecture takes advantage of two effects; First, the ferroelectric mechanism for storing the weights in the form of the polarization state of the ferroelectric thin film. The polarization state can affect both the dielectric constant and the piezoelectric coefficient of the ferroelectric film. The programmed state of the film can then affect the deformation of the composite beam upon application of a voltage across the ferroelectric film; and second, the capacitive mechanism for sensing the beam displacement due to the applied bending moments. As the beams bend, the capacitance is a nonlinear function of the gap change. The capacitance can be measured and the displacement determined from the measured capacitance, to measure the product of the stored weight and the input voltage. Because two capacitors are in series, where one decreases and the other increases by the same displacement, the capacitance change effect on the voltage at the output of the capacitors is linearized.

In some examples, the length of the beams can be from hundreds of nanometers to about tens of microns (e.g., 10-50 microns) or even down to about 5 microns. Smaller sized beams lead to higher density neural computing engines. When the sizes are small, displacements with actuation are also small. This then, in turn, requires reducing the gaps (e.g., spacing between $V_{out}$ and $V_{DD}$ terminal, spacing between $V_{out}$ and $-V_{DD}$ terminal, etc.). This scaling trade-off is described below in more detail. In some examples, the width of the structural beams is 10 nm and above and, in general, smaller than the length to maintain cantilever like motion. The width is, in general, smaller than the length by a factor of about 2 to maintain a cantilever like bending.

In some examples, the ferroelectric films can comprise AlScN (e.g., deposited using sputtering), HZO (e.g., deposited using ALD), and/or PZT (e.g., deposited by sol-gel, pulsed laser deposition, sputtering, etc.). In some examples, the structural layer forming the structural beams comprises an insulating layer such as silicon-dioxide, silicon-nitride, or aluminum nitride. In some examples, a thicker bottom layer and a thin top layer will advantageously serve as a unimorph for a computation unit.

In some examples, dimensions of the anchors or supports for the structural beams are commensurate to the structural beam width to facilitate high pitch densities. By way of example, in some semiconductor processes, such as a CMOS process, the anchors can be 100 nm to a few microns made by a via forming process. For CMOS compatibility the voltages are preferably in the 0.5V to 1.5V range but can be higher for other semiconductor processes.

A cross-sectional view of an example device is shown in FIG. 1. The example device includes two separate beams, which can be referred to as the L (left side) beam and the R (right side) beam. As used herein, spatial terms such as, but not limited to "left," "right," "top" and "bottom" are used for purposes of illustration and convenience only, not limitation. For instance, in some examples, "right side" is synonymous with "first side" and "left side" is synonymous with "second side," or vice versa. As an additional example, "top surface" is synonymous with "first surface" and "bottom surface" is synonymous with "second surface," or vice versa. Stated different, designations such as left, right, top or bottom can describe spatial relations between constituent parts with respect to a particular view or figure but are not to be interpreted as absolute spatial relations relative to a different reference frame.

A technique for storing weights for multiplication of inputs is described using three modes: mode 0, mode 1, and mode 2.

Mode 0: Resetting of the Ferroelectric Layer/Film

The ferroelectric film in the device may be oriented in either an up direction or a down direction depending on the device fabrication. The ferroelectric domains can be "reset" as shown in FIG. 1 depicts voltages that are applied to the L and R sides such that the L and R side ferroelectric films are polarized in opposite directions (regardless of any initial orientation after initial fabrication). For domain reset, a voltage is applied as: Voltage+$V_{in}$(≥Coercive voltage V') and −$V_{in}$(≤−Coercive voltage V') on the bottom electrode of the left-side and right-side beam, respectively. This configuration causes the ferroelectric film on the left beam to orient downwards and the right beam to orient upwards. FIG. 1 depicts voltages that are applied to the L and R sides such that the L and R side ferroelectric films are polarized in opposite directions (regardless of any initial orientation after initial fabrication).

Mode 1: Storing Weights

Weights can be stored by controlling the domains as up or down in a specific subsection of the beams. The ferroelectric can be programmed with a voltage across the source and drain such that only a given fraction, x, of the length, L, of the beam is programmed up or down.

$$\text{Ferro-Domain Fraction } f = \frac{x}{L} = \frac{\text{Ferro Up}}{\text{Ferro Up} + \text{Ferro Down}}. \quad \text{EQ. (1)}$$

Figure 2:
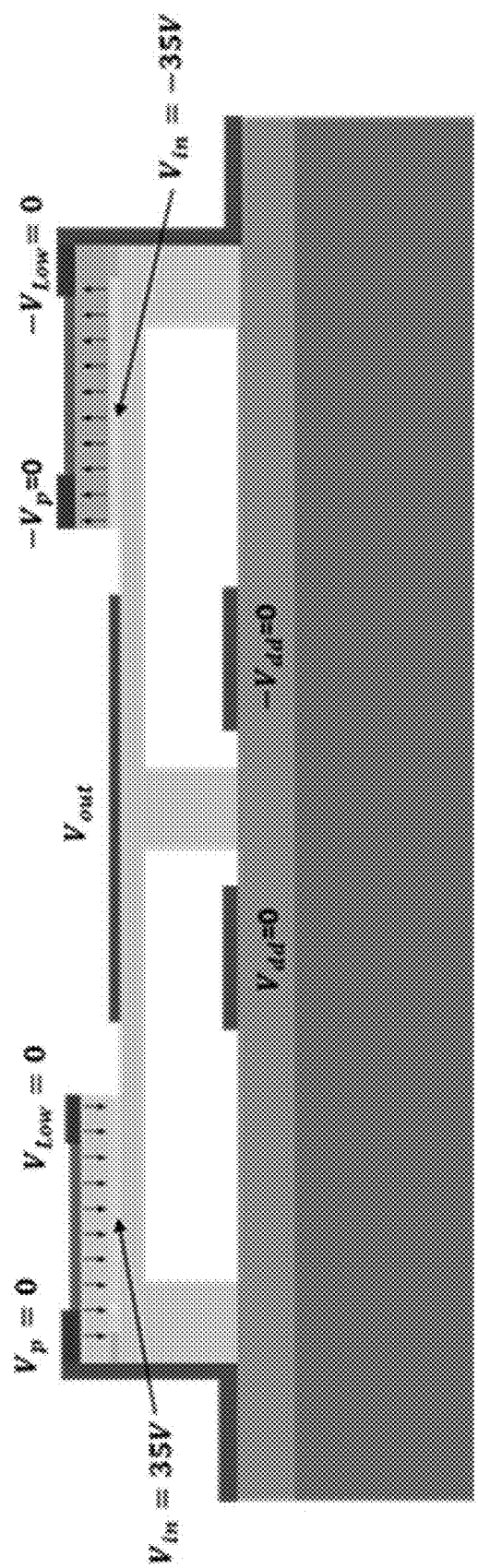
FIG. 2 depicts a schematic cross-sectional view of a device with voltages applied to the left and right sides such that the left and right side ferroelectric films are polarized in opposite directions, in accordance with some example embodiments.

The ferro-domain fraction calculation is explained in the next section. FIG. 2 depicts applying a voltage gradient across the source and drain voltages to program the ferroelectric domains.

Figure 3:
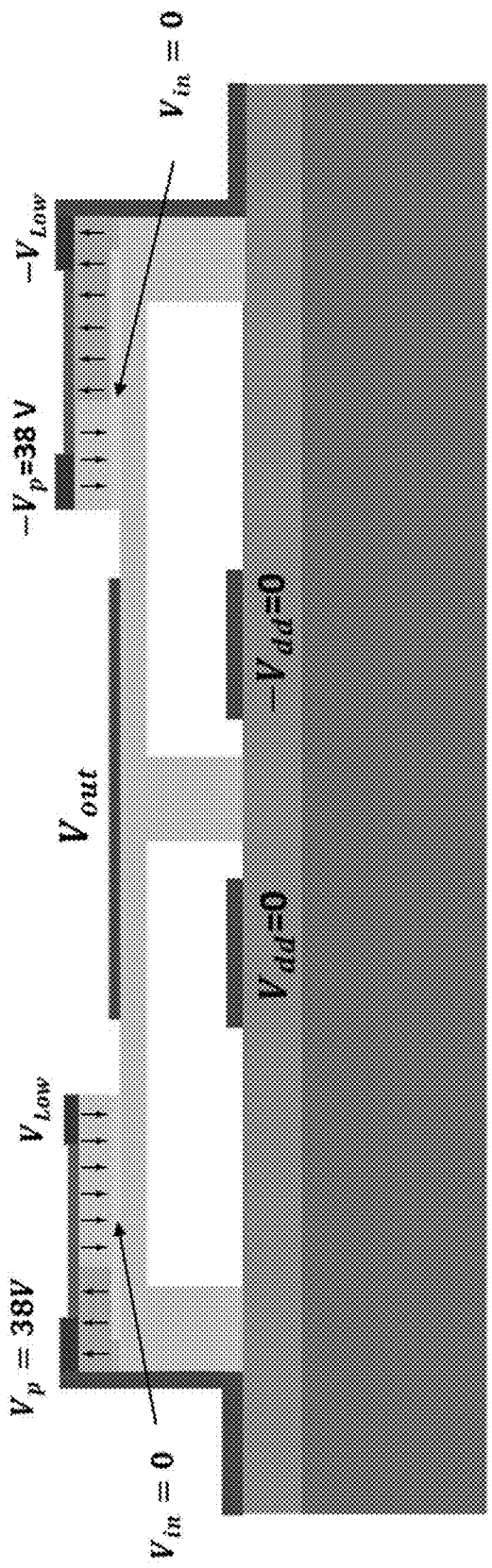
FIG. 3. depicts a schematic cross-sectional view of a device with a voltage gradient applied to the source and drain voltages to program the ferroelectric domains.

In this mode, the bottom electrode ferroelectric capacitor, $V_{in}$, is grounded and a voltage applied across the resistive layer on the left and right electrodes. As shown in FIG. 3, anti-symmetric voltages are used on the left and right-side ferroelectric films. FIG. 3 includes a table showing some example voltages for an example mode 0, mode 1, and mode 2 scenario.

Figure 4A:
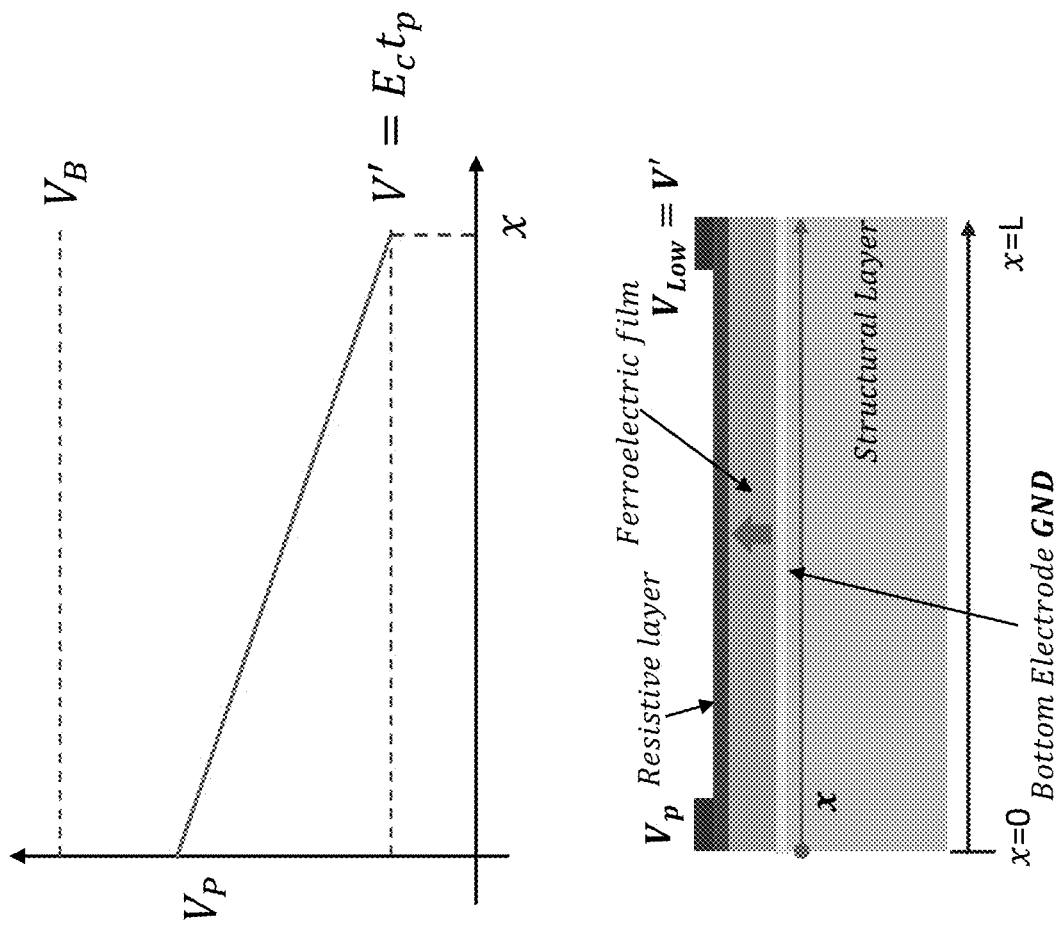
FIG. 4A shows an example of four cases related to storing weights.

FIG. 4A shows an example of four cases related to storing weights. In a first case, $V_{Low}$=V', where V' is the coercive voltage (=$E_c t_p$, where $E_c$ is the ferroelectric film's coercive field and $t_p$ is the ferroelectric film thickness), and $V_{Low}$ is a voltage applied to one of the electrodes, and another voltage, $V_p$, is applied to another electrode across form the resistive layer or film. In this case all ferro-domains will get oriented in upward direction, so that Ferro-domain fraction α=1. In case 2, $V_{Low}$=0.5×V'. In this case $V_{Low}$ is below V' and above ground. Here, f=0.8. In case 3, $V_{Low}$=0 V. $V_{Low}$ is connected to ground. Here, f=0.7. In case 4, $V_{Low}$=−0.5×V', $V_{Low}$ is below ground. i.e., negative, and α=0.57.

FIG. 3B depicts an example of a linear voltage variation and polarizing fractions of a ferroelectric capacitor. As shown in FIG. 4A shows an example of four cases related to storing weights. In a first case, VLow=V', where V' is the coercive voltage (=Ectp, where Ec is the ferroelectric film's coercive field and tp is the ferroelectric film thickness), and VLow is a voltage applied to one of the electrodes, and another voltage, Vp, is applied to another electrode across form the resistive layer or film. In this case all ferro-domains will get oriented in upward direction, so that ferro-domain fraction α=1. In case 2, VLow=0.5×V'. In this case VLow is below V' and above ground. Here, f=0.8. In case 3, $V_{Low}$=0 V. $V_{Low}$ is connected to ground. Here, f=0.7. In case 4, $V_{Low}$=−0.5×V'. VLow is below ground. i.e., negative, and α=0.57.

FIG. 3B depicts an example of a linear voltage variation and polarizing fractions of a ferroelectric capacitor, when voltage $V_p$ is applied on one side and $V_{low}$ on the other side, a linear potential gradient is generated along the resistive layer of length L. The lower bound of $V_p$ is limited by coercive voltage V' and the upper bound is limited by the breakdown voltage $V_B$ of the ferroelectric film. Similarly, the voltage $V_{low}$ value is less than the coercive voltage V' to achieve the fractional control of the ferroelectric domain orientation. As the voltage $V_p$ is increased by keeping $V_{low}$ constant, the voltage gradient increases and which in turn increases the ferro-domain fraction, f, on the left beam. Because of anti-symmetry, the ferro-domain fraction on the right beam is (1-f).

Ferro-Domain Fraction Calculation:

The ferroelectric direction is flipped when a voltage that is greater than the coercive voltage, V'=$E_c t_p$, is applied across the ferroelectric film. Here, $E_c$ is the coercive field and $t_p$ is the thickness of the ferroelectric film. The resistive layer has a linear voltage drop across it. The voltage at any point, x, along the length, L, is given by, $$V_x = (V_p - V_{Low})\left(1 - \frac{x}{L}\right) \quad \text{EQ. (2)}$$

The condition for ferroelectric domain flipping will be, $$V_x = V' - V_{Low} \quad \text{EQ. (3)}$$

$$\therefore V' = E_c t_p = (V_p - V_{Low})\left(1 - \frac{x}{L}\right) + V_{Low} \quad \text{EQ. (4)}$$

After simplification, the ferro-domain fraction, f, can be expressed as:

$$f = \frac{x}{L} = 1 - \frac{V' - V_{Low}}{V_p - V_{Low}} = \frac{V_p - V'}{V_p - V_{Low}} \quad \text{EQ. (5)}$$

From the foregoing equation, the Ferro-domain fraction, f, is a function of voltage $V_p$. This function is non-linear in nature, but within a range, the function can be approximated as a linear function. To plot this, the following parameters for Sc—AlN ferroelectric film can be considered:

$$V' = E_c \times t_p = 3.5\frac{MV}{cm} \times 100nm = 35 \text{ V}; \; V_{Low} = \frac{V'}{2}; \; V_B = 1.2 \times V' \quad \text{EQ. (6)}$$

Figure 4B:
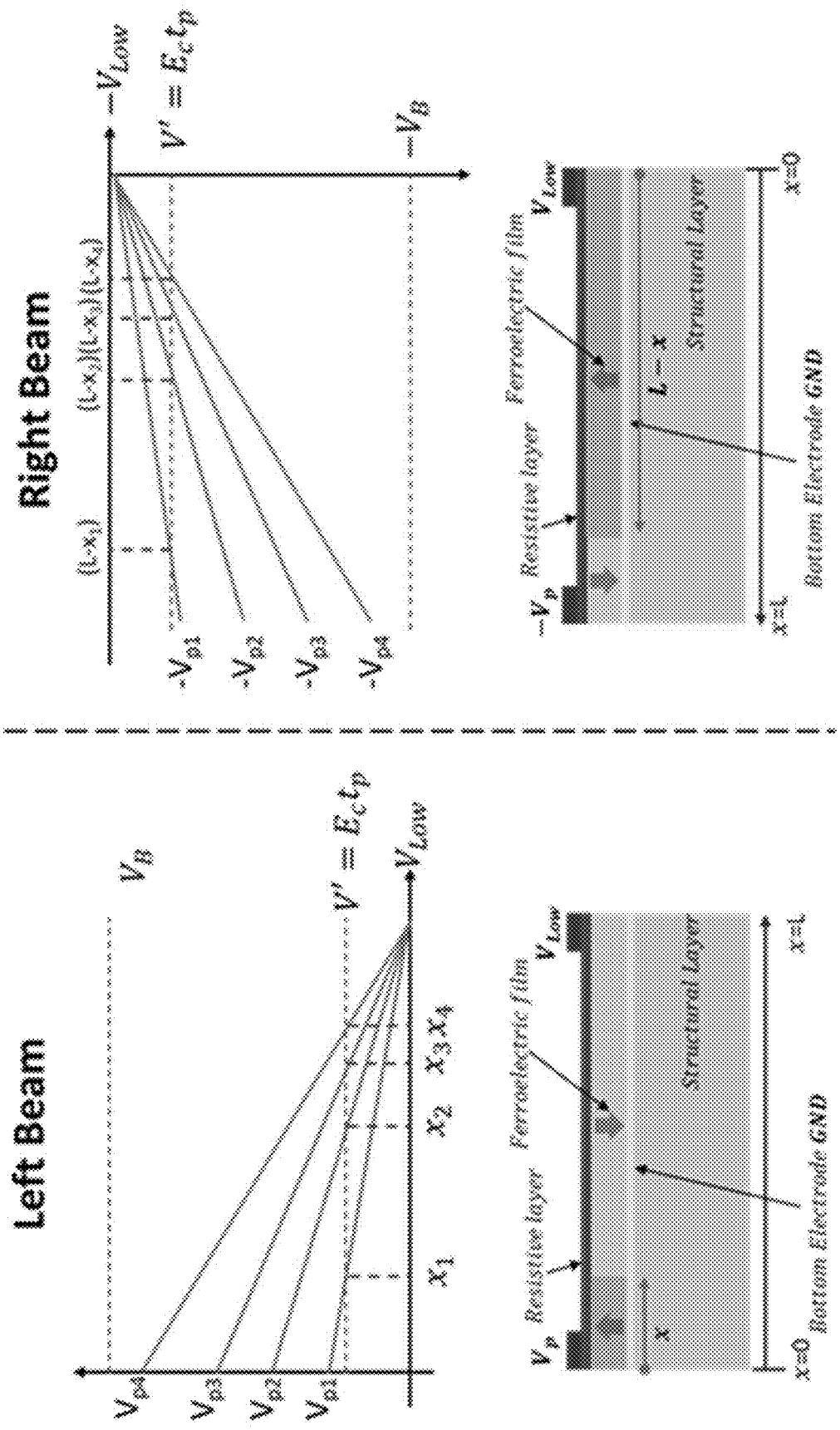
FIG. 4B depicts plots showing a linear voltage variation and corresponding polarizing fractions of a ferroelectric capacitor, in accordance with some example embodiments.
Figure 5:
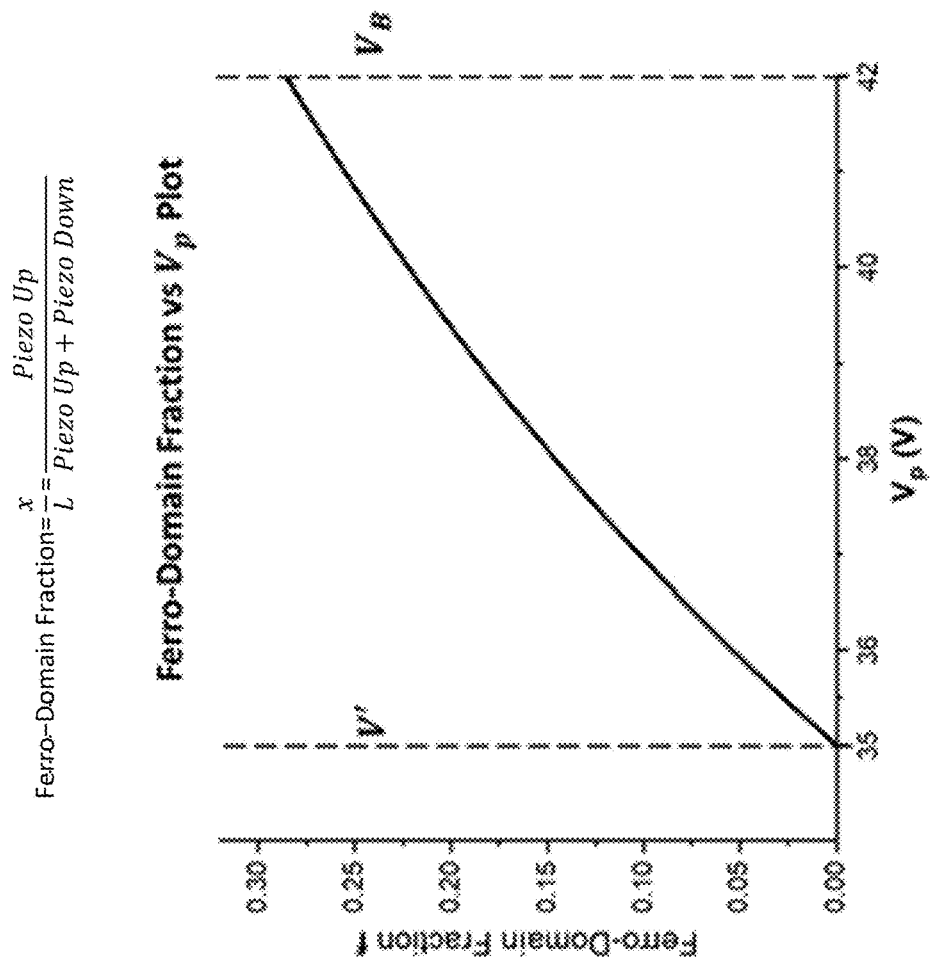
FIG. 5 depicts an example of a plot of a Ferro-Domain Fraction (f) as a function of applied voltage $V_p$ with lower bound V' (coercive voltage) and upper bound $V_B$ (Breakdown voltage) for an example scandium (Sc)-aluminum nitride (AlN) (Sc—AlN) ferroelectric film.

Note that these voltages can be much lower for ferroelectric materials with substantially lower $E_c$ or much thinner films. FIG. 5 depicts an example of a Ferro-domain fraction, f, vs $V_p$. The ferro-domain fraction, f, is almost a linear function of $V_p$ in a given voltage range. Thus, a weight value can be input as a voltage $V_p$ and stored in the form of ferro-domain fraction f. FIG. 4 depicts an example of a ferro-domain fraction, f, as a function of applied voltage $V_p$ with lower bound V' (coercive voltage) and upper bound $V_B$ (breakdown voltage) for an example Sc—AlN ferroelectric film.

Mode 2: MAC (Multiply and Add Calculations)

Once the weights are stored, the input voltage, $V_{in}$, is applied to the bottom electrode by connecting $V_p$ and $V_{Low}$ to the ground terminal. FIG. 5 depicts an example of applying the same $V_{in}$ on both L and R beams, resulting in a differential output at the $V_{out}$ terminal.

The applied voltage across the ferroelectric film generates the bending moment on the beam. This causes a change in the gap between parallel plates formed due to $V_{out}$ and $V_{dd}$ terminal. Even though the same input voltage $V_{in}$ is applied on both left and right beams, the bending moment will be in the opposite direction due to the anti-symmetric ferroelectric (FE)-domain. The output voltage $V_{out}$ can be calculated using a capacitive divider circuit configuration. Thus, $$V_{out} = V_{dd} \frac{C_L - C_R}{C_L + C_R} \text{ where, } C_L = \frac{\varepsilon_0 A}{(g - x_L)}; \quad C_R = \frac{\varepsilon_0 A}{(g - x_R)}; \quad \text{EQ. (7)}$$

g=gap between clamped-clamped beam and the $V_{dd}$ electrode
$x_L$=Bending displacement of Left beam
$x_R$=Bending displacement of Right beam.
A=cross-section area of the $V_{dd}$ electrode When the bending displacement, $x_L$ and $x_R$, is small compared to gap, g, a binomial approximation can be used to simplify the $V_{out}$ equation which can be expressed as:

$$C_L \cong \frac{\varepsilon_0 A}{g}\left(1 - \frac{x_L}{g}\right); \quad C_R \cong \frac{\varepsilon_0 A}{g}\left(1 - \frac{x_R}{g}\right) \quad \text{EQ. (8)}$$

$$\therefore V_{out} = V_{dd} \frac{C_L - C_R}{C_L + C_R} \approx \frac{(x_L - x_R)}{2g - \gamma(x_L + x_R)} \approx \frac{(x_L - x_R)}{2g} \approx \Gamma(V_p \cdot V_{in}) \quad \text{EQ. (9)}$$

where, Γ=Scale factor.

From the above equations, the output voltage $V_{out}$ can be seen as a function of a product of two input voltages, $V_p$ and $V_{in}$, with a constant scale factor Γ. This scale factor, Γ, is a function of beam geometry, spring constant, k, gap, g, area, A, and ferroelectric material properties.

Figure 6:
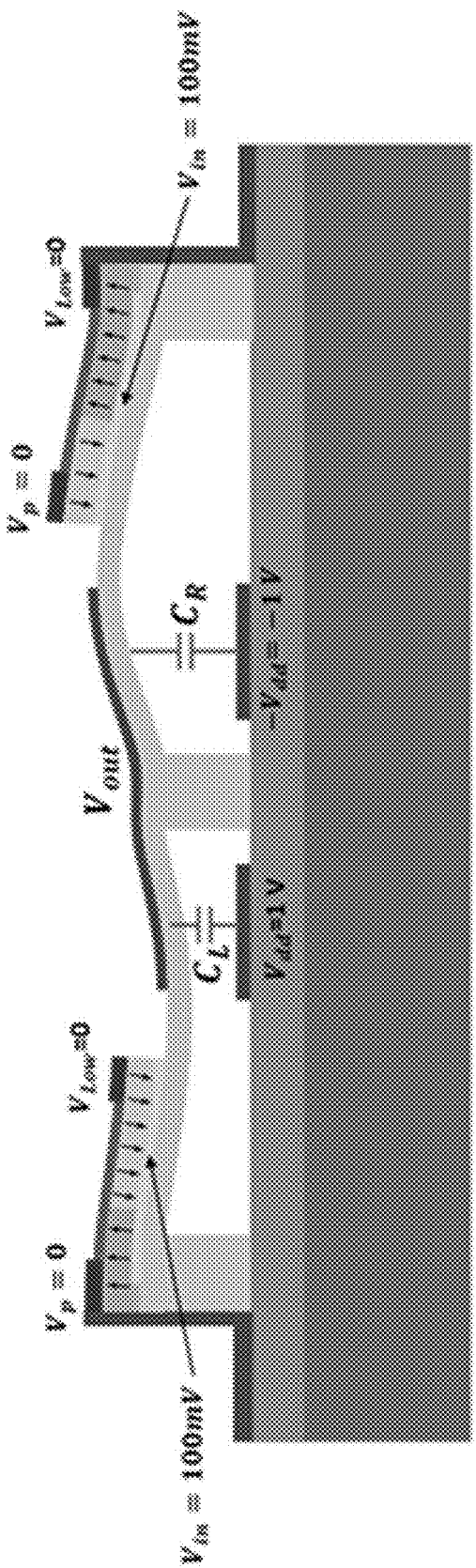
FIG. 6 depicts a schematic cross-sectional view of a device showing the same $V_{in}$ to both left and right beams to generate a differential output at a $V_{out}$ terminal, in accordance with some example embodiments.

FIG. 6 depicts an example of one dimensional (1D) beam displacement along the beam length for different ferro-domain fractions at constant input voltage $V_{in}$=1V.

Multi-physics simulation (e.g., COMSOL) of the ferro-NEMS structure was performed to simulate the left ($x_L$) and right ($x_R$) beam displacements after application of the same input voltage, $V_{in}$, across both the left and right ferroelectric film. The ferro-domain fraction, f, which is a linear function of weight voltage $V_p$ (equation EQ. (9)), can be varied to plot a transfer characteristics of the ferro-NEMS multiplier device.

Figure 7:
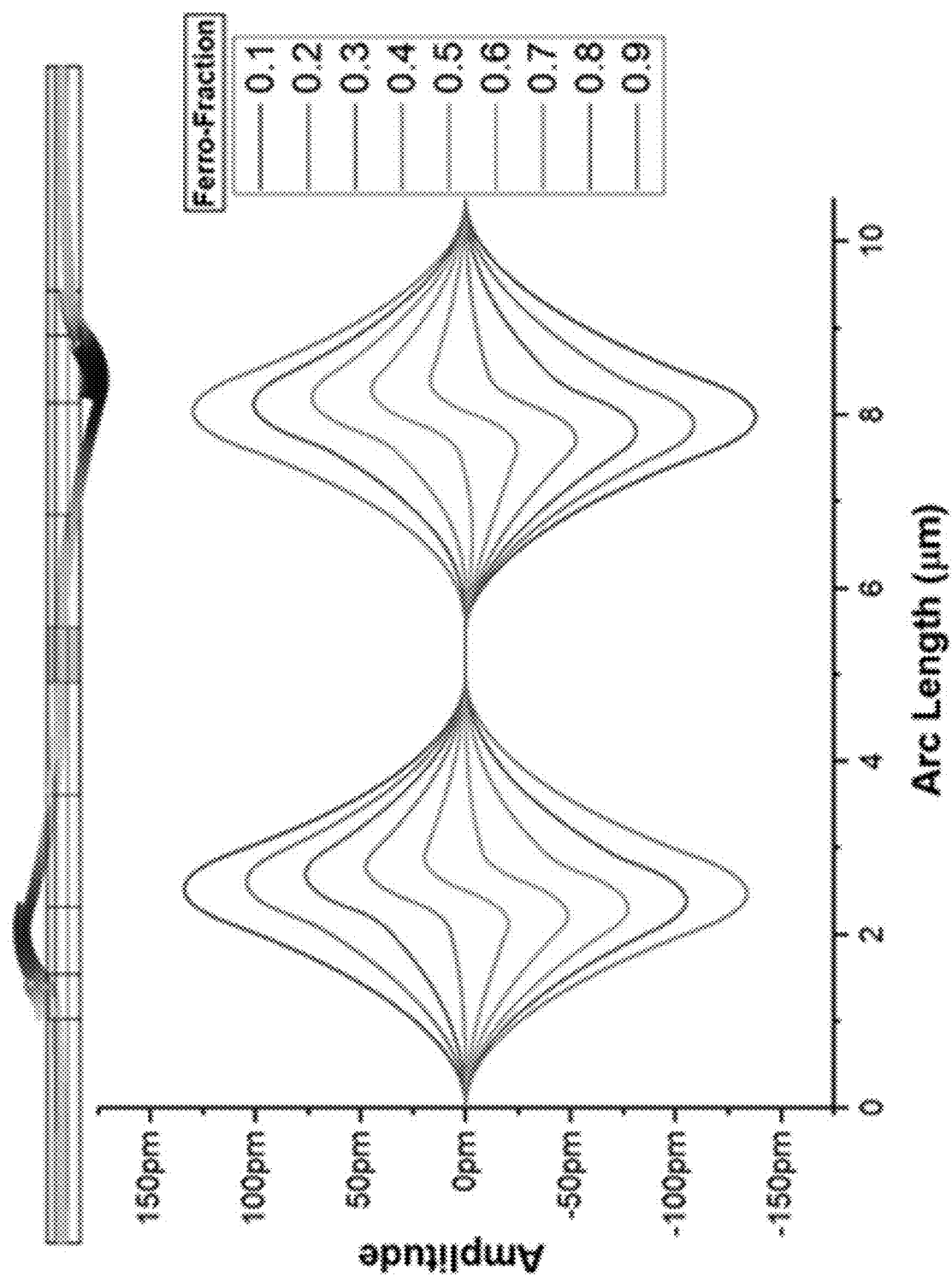
FIG. 7 depicts example plots of 1D beam displacement along the beam length for different Ferro-domain fractions at constant input voltage Vin=1V, in accordance with some example embodiments.

From the FIG. 7 depicts an example of transfer characteristics including output voltage (Vout) vs input voltage (Vin) for different ferro-domain fractions, the scale factor can be calculated as:

$$\Gamma = \frac{\text{Slope of the transfer characteristics}}{V_p} \quad \text{EQ. (10)}$$

Considering an inference neural network, storing/updating weights is a less frequent task compared to MAC operations. Thus, the device operates in a very energy-efficient "mode 2".

Because there is no physical connection between the electrodes, the leakage current value is negligible. When a MAC calculation is performed, it generates a motional current due to a change in capacitance. Thus, Power=V·I is only consumed while the beam moves from one state to another. In an idle state or steady-state position, no power is consumed. This is in contrast with CMOS transistor-based neuromorphic devices which consume power even in an idle state.

FIG. 7 depicts an example of transfer characteristics including output voltage ($V_{out}$) vs input voltage ($V_{in}$) for different ferro-domain fractions.

Frequency Tuning of Linearly Graded Poled Ferroelectric Device

Figure 8:
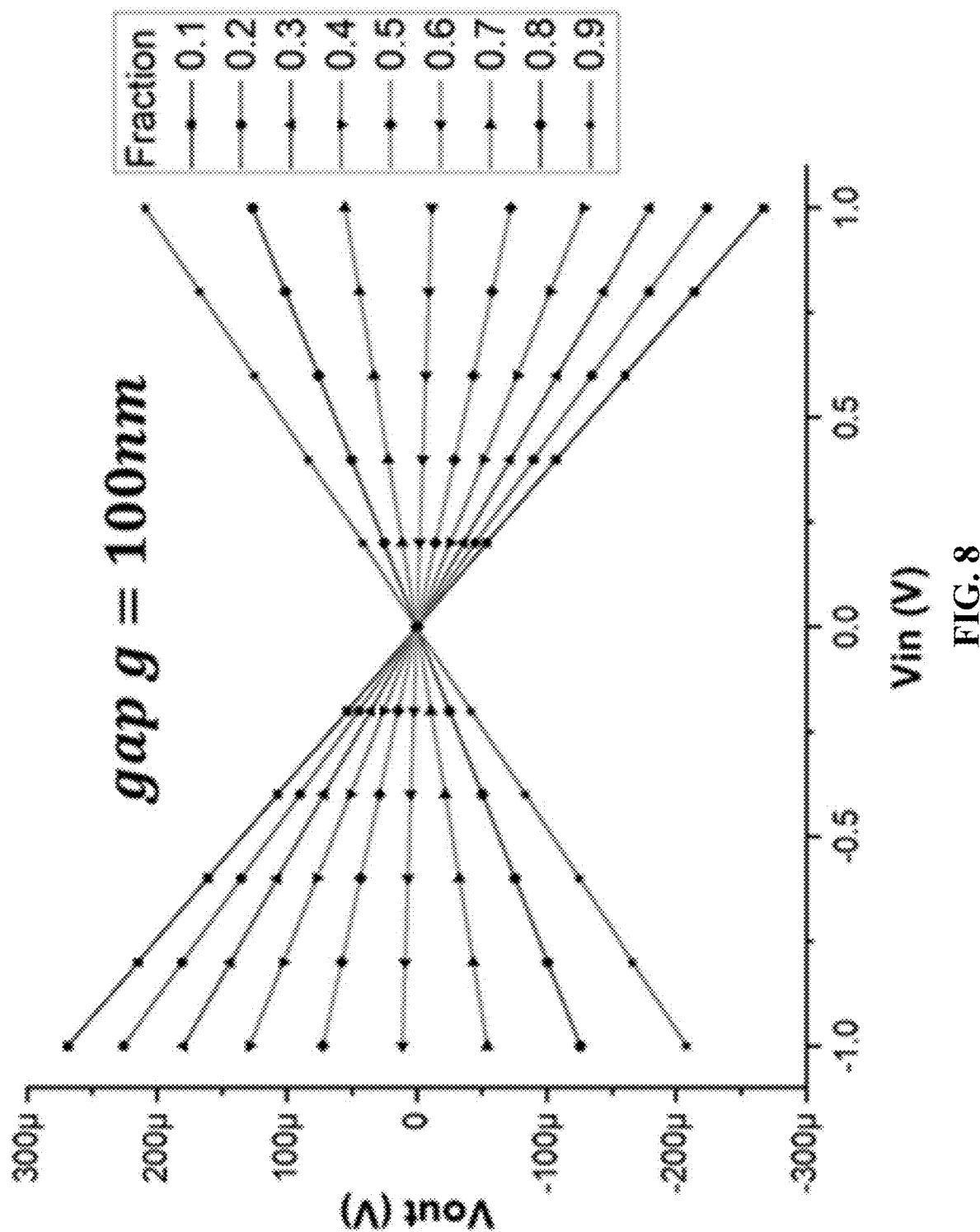
FIG. 8 depicts example transfer characteristics of output voltage ($V_{out}$) vs. input voltage ($V_{in}$) for different Ferro-domain fractions.
Figure 9:
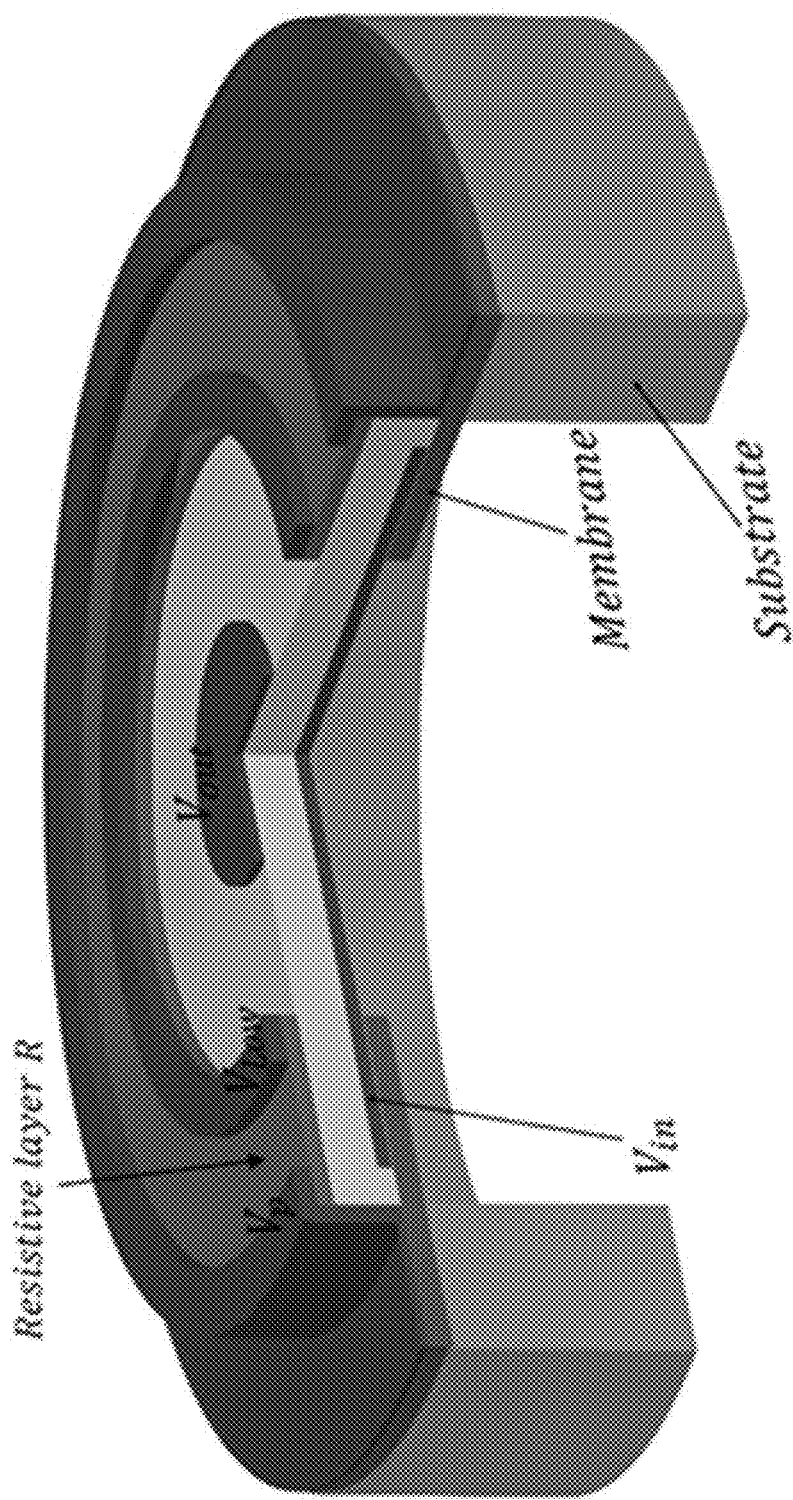
FIG. 9 depicts an example of a resonator device, in accordance with some example embodiments.

The mechanism used above for storing weights can also be used to induce a controllable bending moment of a released structure. By modifying the stress in the ferroelectric film, the resonance frequency can be shifted of a composite ferroelectric resonator operating as a FBAR (Thin Film Bulk Acoustic Resonator), CMR (Contour Mode Resonator), and in general, ferroelectric ultrasonic micromachined transducers. This frequency shift can be important to tune a resonator to a specific frequency as the frequency changes due to errors in fabrication and temperature. FIG. 8 depicts an example of cross-sectional view of a resonator as described above.

The resonance frequency dependence of the $[m,n]^{th}$ mode an FBAR can be written as:

$$f = \left(\frac{1}{2}\sqrt{\frac{T}{\rho}}\sqrt{\left(\frac{m}{a}\right)^2 + \left(\frac{n}{b}\right)^2}\right)^2 + \left(\frac{\pi}{2}\sqrt{\frac{Y\kappa^2}{\rho}}\sqrt{\left(\frac{\beta_m^2}{a}\right)^2 + \left(\frac{n\beta_n^2}{b}\right)^2}\right)^2 \quad \text{EQ. (11)}$$

where, T is the stress in the film, Y is the Young's modulus, ρ is composite film density, and a and b are lateral dimensions of a nominally rectangular FBAR. The constants m, n, a, b, ρ, are fixed. Y and T can be modulated due the change in acoustic velocity in the material and the coupling coefficient $k_t^2$ which depend on piezoelectric coefficients as follows:

$$v_l = \sqrt{\frac{Y}{\rho}} \text{ and } k_t^2 = \frac{e_{33}^2}{\epsilon_r \epsilon_0 c_{11}} \quad \text{EQ (12)}$$

Based on the change in $k_t^2$ and $v_l$, tuning of the resonance frequency (by stress tuning) and the coupling coefficient by (by piezoelectric coefficient tuning) can be achieved. In some example embodiments, the tuning can be about 10%. An advantage of the disclosed approach is temperature-independent frequency tuning. Typically, frequency tuning is either static by means of resonator trimming i.e., etching of the resonator material or by ovenization i.e., temperature control. The former is limited by one-time frequency tuning and only works to increase the frequency and the latter has high power consumption due to the use of a chip-scale heater. Ferroelectric tuning eliminates both of these issues with electrical control of tuning the frequency. Furthermore, hysteresis in tuning is only limited by fatigue in the material and can be done for more than one million cycles.

FIG. 10A shows a table comparing energy requirements for various technologies at 1000 and some dimensions for illustrative devices at 1010. At 1000, various technologies that can implement a MAC type of device are shown and the corresponding energy requirements. The disclosed FerroNEMS technology requires much less energy at approximately 1 attojoule (aJ) to 1 femtojoule (fJ). The next closest technology requires 0.2 picojoules (pJ). At 1010, a table showing some example dimensions of a typical device consistent with the disclosed subject matter are shown. Smaller and larger device dimensions are also possible using the disclosed technology.

FIG. 10B includes a table showing a comparison of some example gate material properties at 1020. Shown at 1030, are some example material properties for a Sc—AlN layer with the dimensions shown.

Figure 11A:
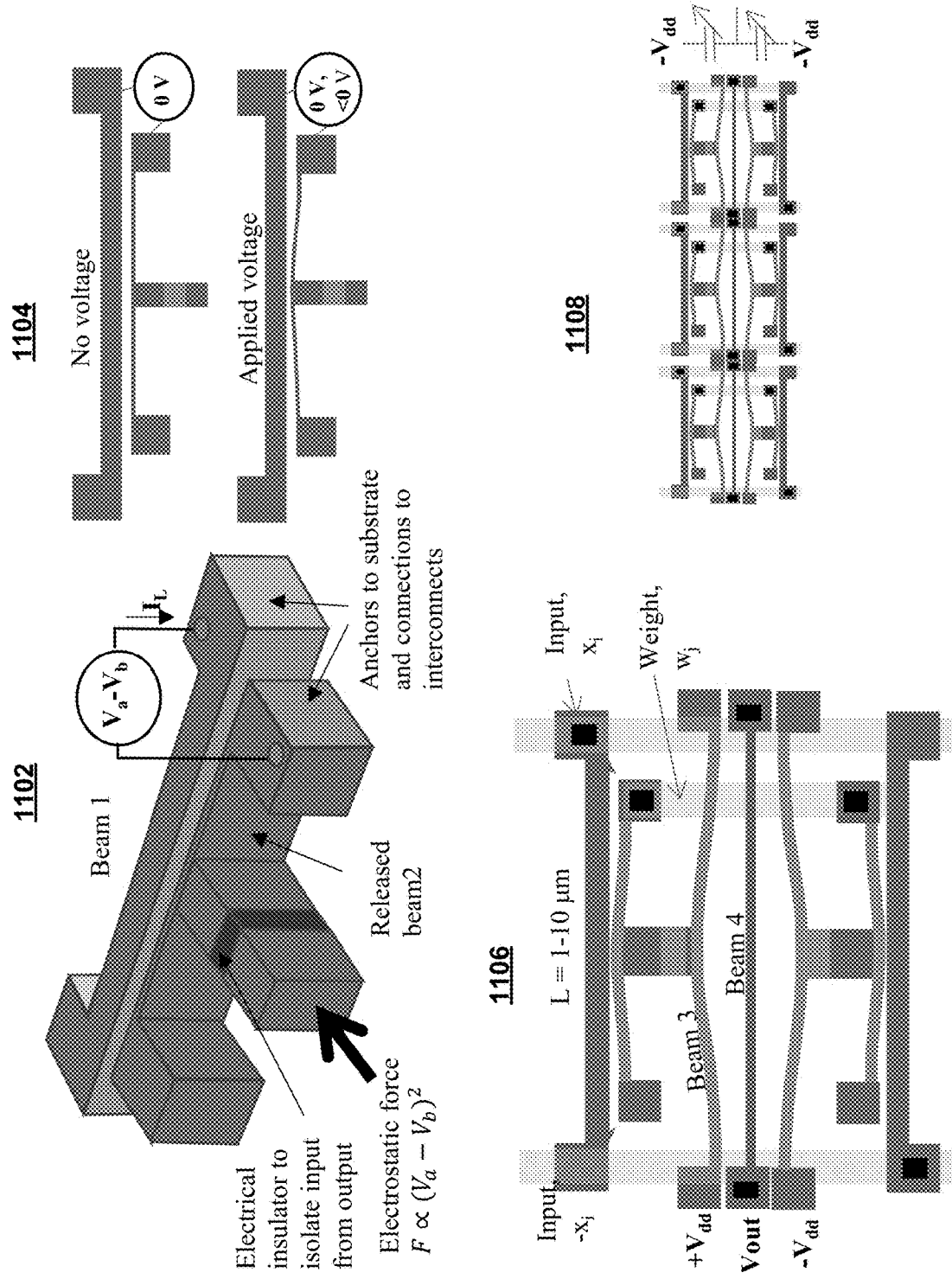
FIG. 11A shows examples of lateral nano-electromechanical systems (NEMS) multiply and add calculator (MAC) designs.

FIG. 11A shows examples of a lateral NEMS MACs. At 1102 is an isometric view showing a device with two beams, anchors to the substrate and the location of an electrostatic force generated. At 1104, is a top view showing parallel beams when no voltage is applied and a displaced beam when a voltage is applied. At 1106, a design including third and fourth beams is shown with inputs, weights, and an output. At 1108, three of the example devices shown at 1106 are cascaded in series.

Figure 11B:
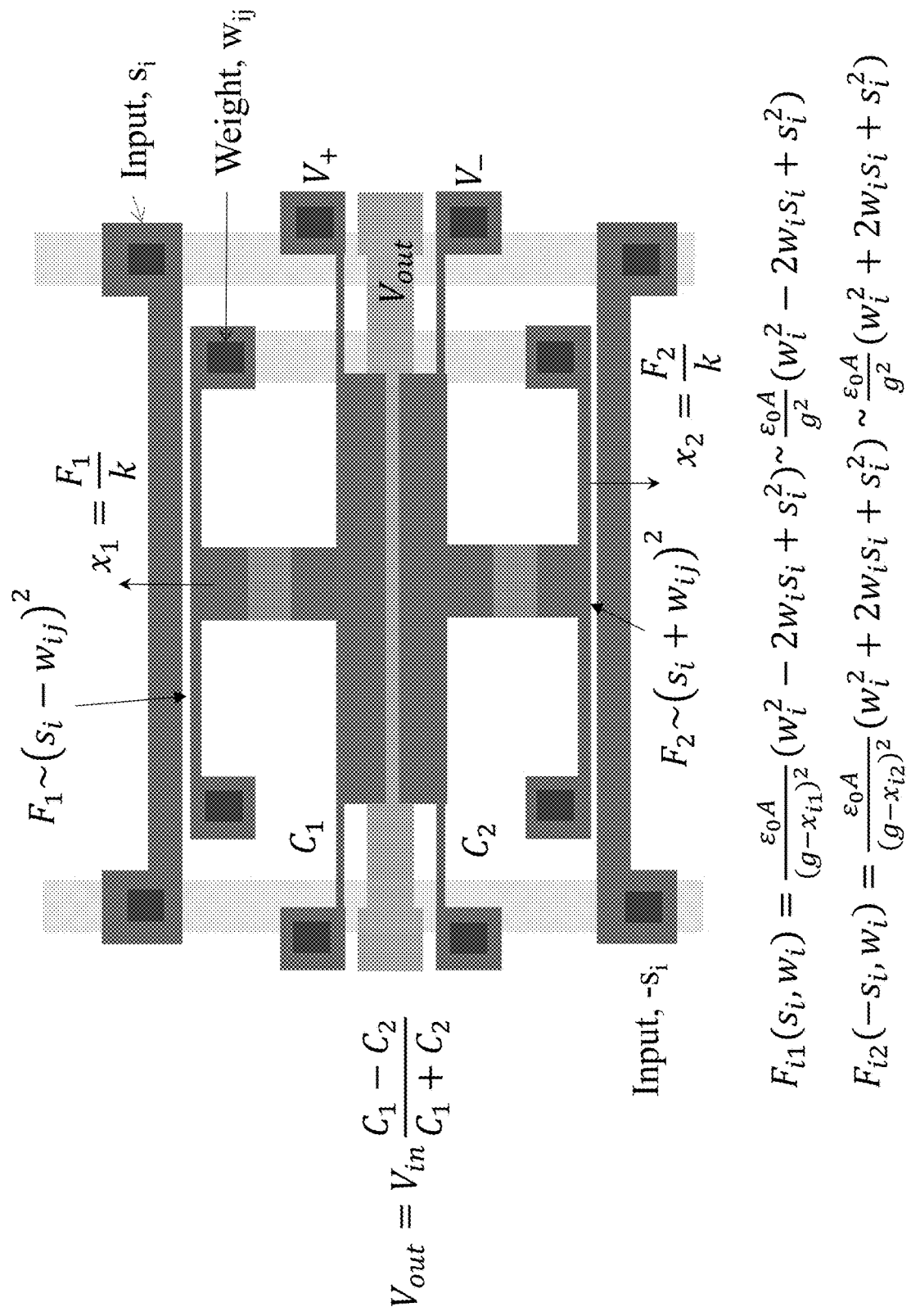
FIG. 11B shows an example of a multiplier requiring nearly zero power, in accordance with some example embodiments.

FIG. 11B shows an example of a multiplier requiring nearly zero power, in accordance with some example embodiments. Also shown are equations expressing the forces generated, the output voltage as a function of input voltage.

Figure 11C:
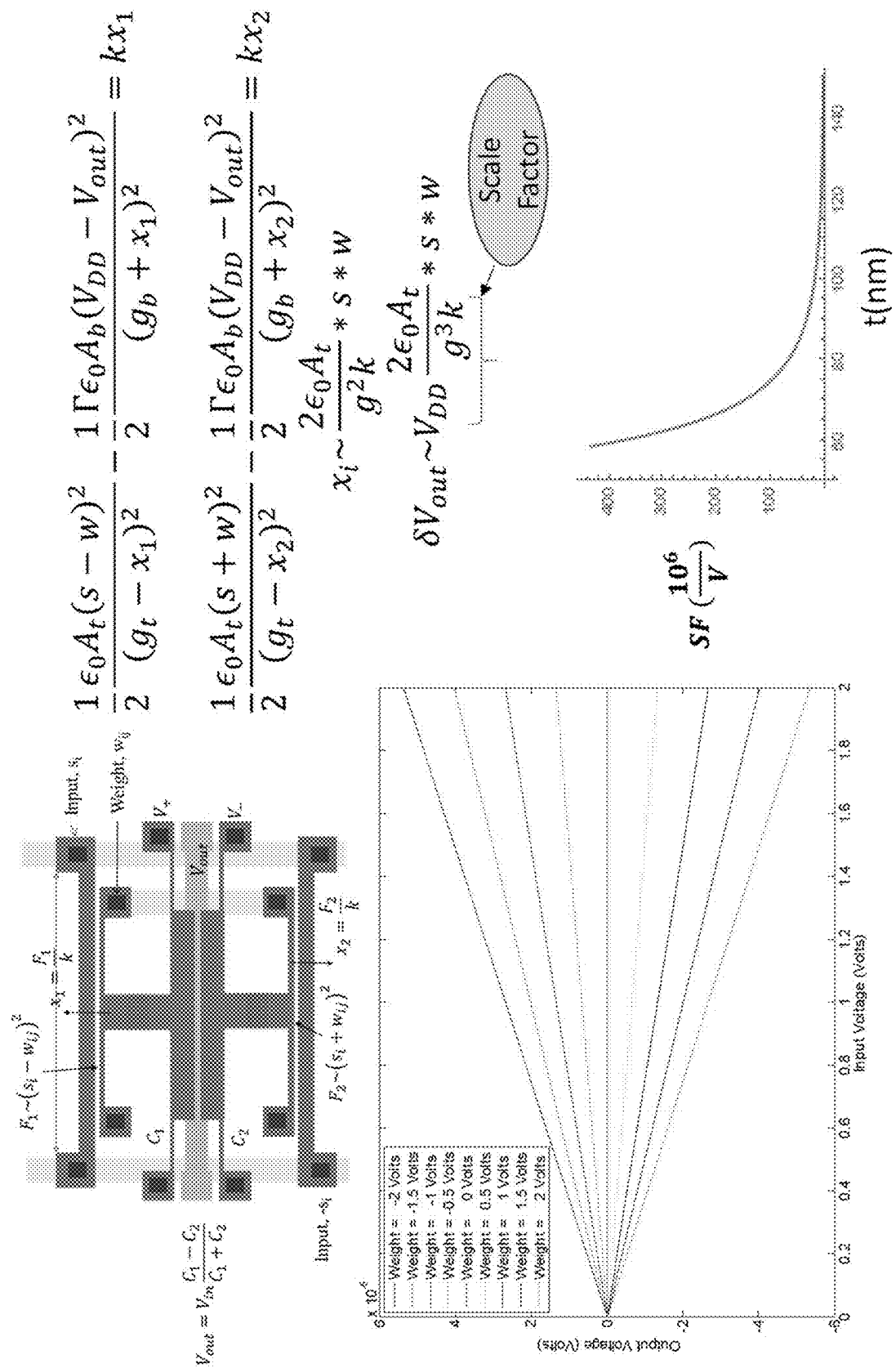
FIG. 11C shows examples of equations of motion for some of the disclosed devices.

FIG. 11C shows examples of equations of motion for some of the disclosed devices. Shown and forces kx1 and kx2, approximations for displacement $x_i$ and $\delta V_{out}$. A plot showing output voltage as a function of input voltage is shown for various weights. Also shown is a plot of a scale factor (SF) as a function of thickness in nanometers.

Figure 11D:
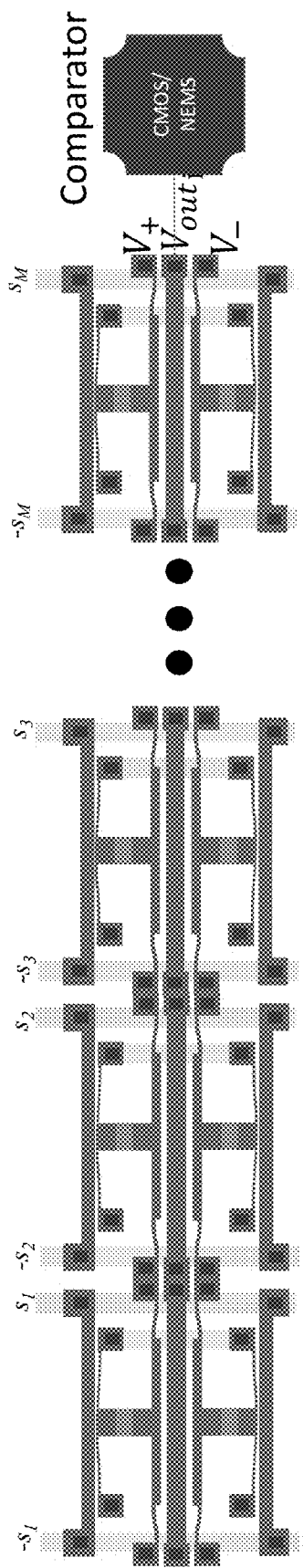
FIG. 11D shows an example of an array of multipliers and adders.

FIG. 11D shows an example of an array of multipliers and adders. Shown is a cascaded array of devices in series and an expression for $V_{out}$ as a function of in part weights $w_i$ and inputs $s_i$.

Figure 11E:
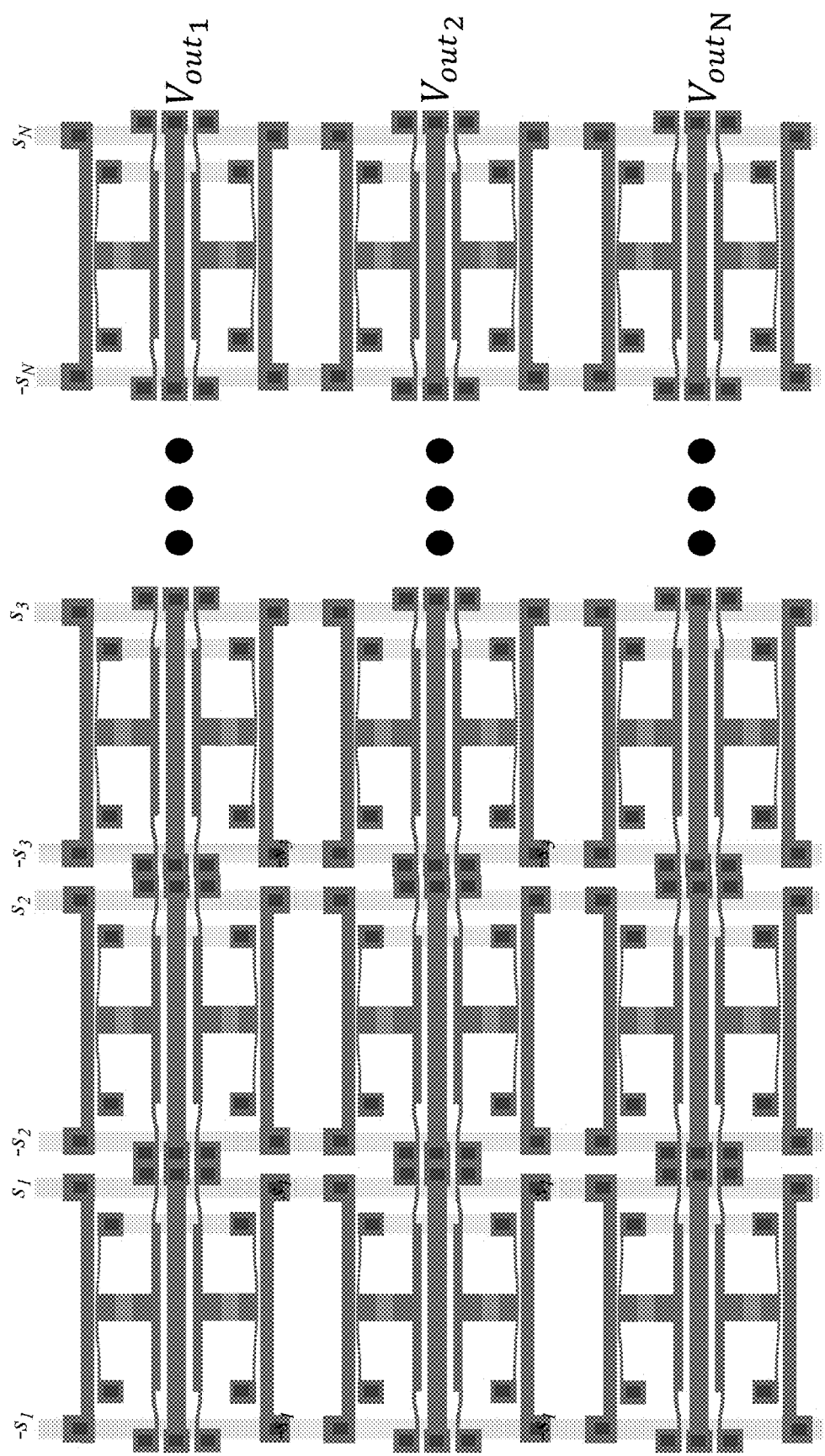
FIG. 11E shows another example of or an array of multipliers and adders.

FIG. 11E shows another example of or an array of multipliers and adders. Shown are a plurality of series arrays producing a plurality of outputs.

Figure 11F:
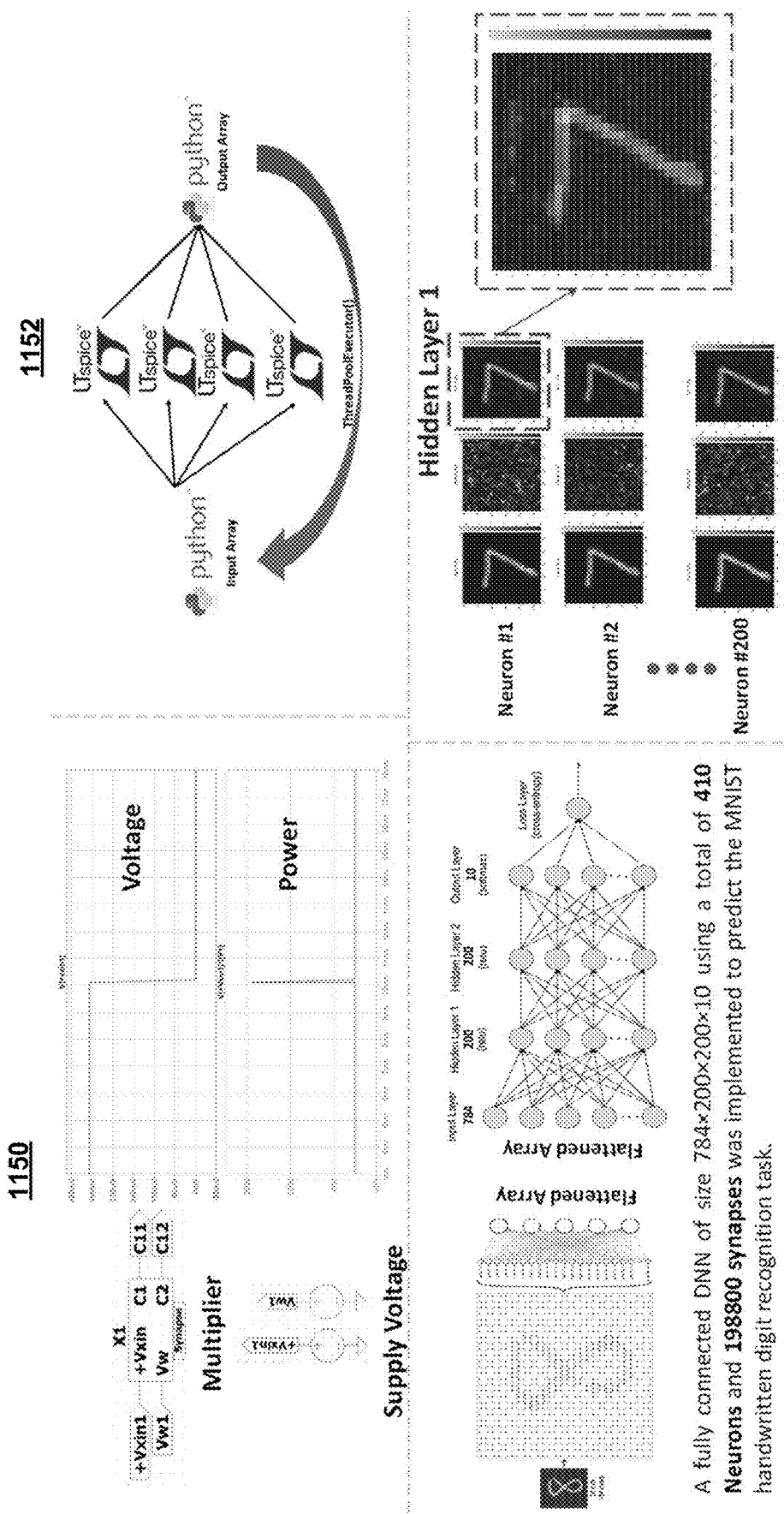
FIG. 11F shows an example of an in-memory computing application, in accordance with some example embodiments.

FIG. 11F shows an example of an in-memory computing application, in accordance with some example embodiments. At 1150, an example of a multiplier is shown with plots of the power consumption and a voltage over time. As can be seen, power consumption is very low, with nearly zero power dissipated. At 1152, a simulation environment is shown. At 1154, a simulation example with 410 neurons and 198800 synapses is shown. At 1156, another simulation is shown with 200 neurons. The disclosed devices can be used in applications requiring a multiplication of two analog values that can be represented by voltages and in applications requiring multiply and accumulate (MAC) that multiplies two analog values and adds. Applications include neural networks such as deep neural networks (DNNs) and many signal processing applications, and other applications requiring the multiplication of two values or the multiplication of two values and adding the result to an accumulator.

FIG. 12 shows an example of a method 1200 for multiplying voltages, in accordance with some example embodiments. At 1210, the method includes receiving a first voltage applied to a first input electrode disposed on a first top portion of a first structural beam, wherein a first ferroelectric film is disposed on a second top portion of the first input electrodes. At 1220, the method further includes receiving a second voltage applied to a first electrode, wherein the first resistive layer is disposed on a third top portion of the first ferroelectric film. At 1230, the method includes generating an output voltage at an output electrode represented by a multiplication of the first voltage and the second voltage. In some example embodiments, the method includes receiving the first voltage applied to second input electrode disposed on another top portion of a second structural beam, wherein a second ferroelectric film is disposed on second top portion of the second input electrode and receiving the second voltage applied to a second electrode, wherein the second resistive layer is disposed on another third top portion of the second ferroelectric film.

Figure 13A:
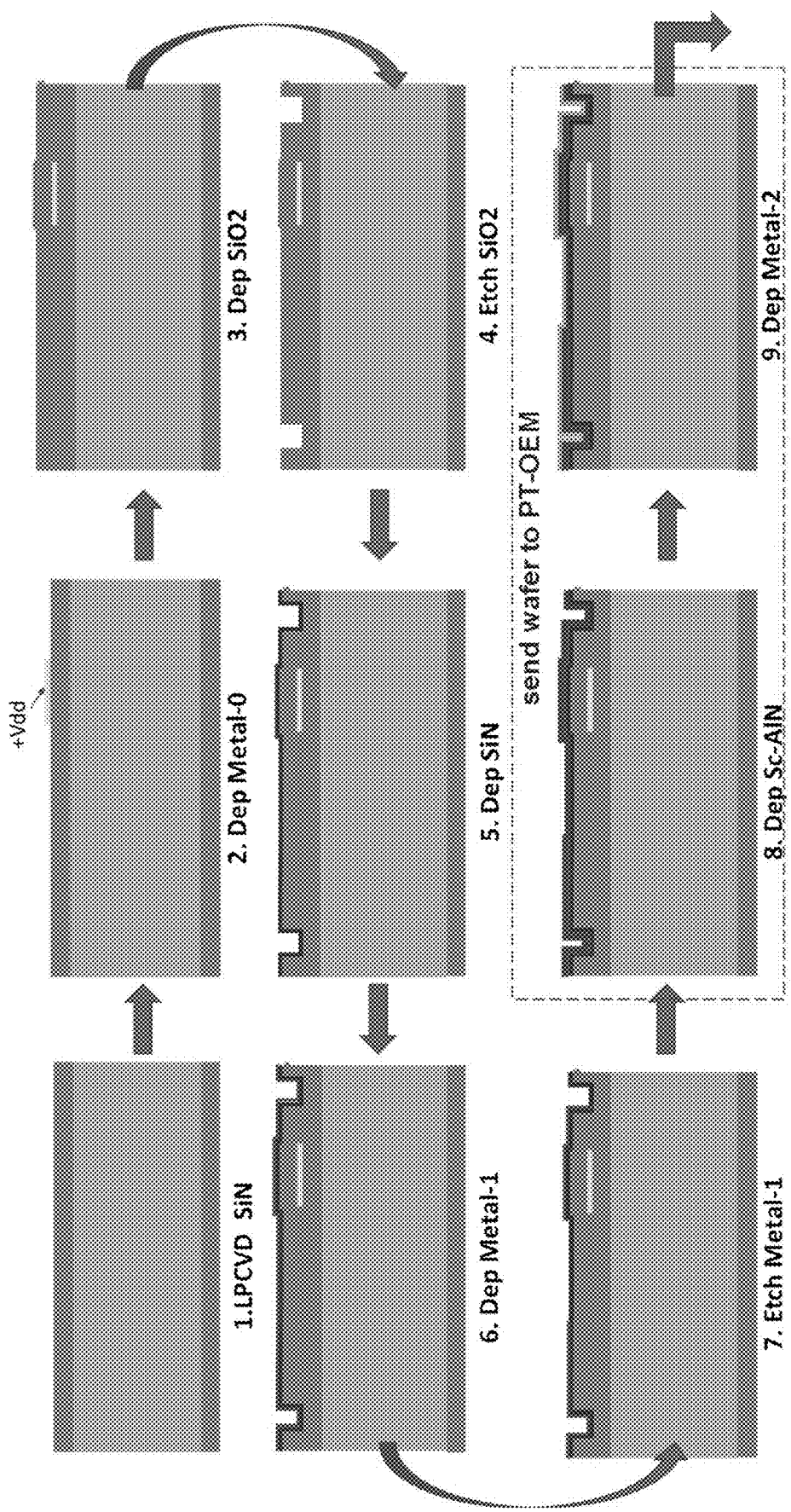
FIG. 13A and FIG. 13B show an example of a process to fabricate example devices in accordance with the disclosed subject matter.
Figure 13B:
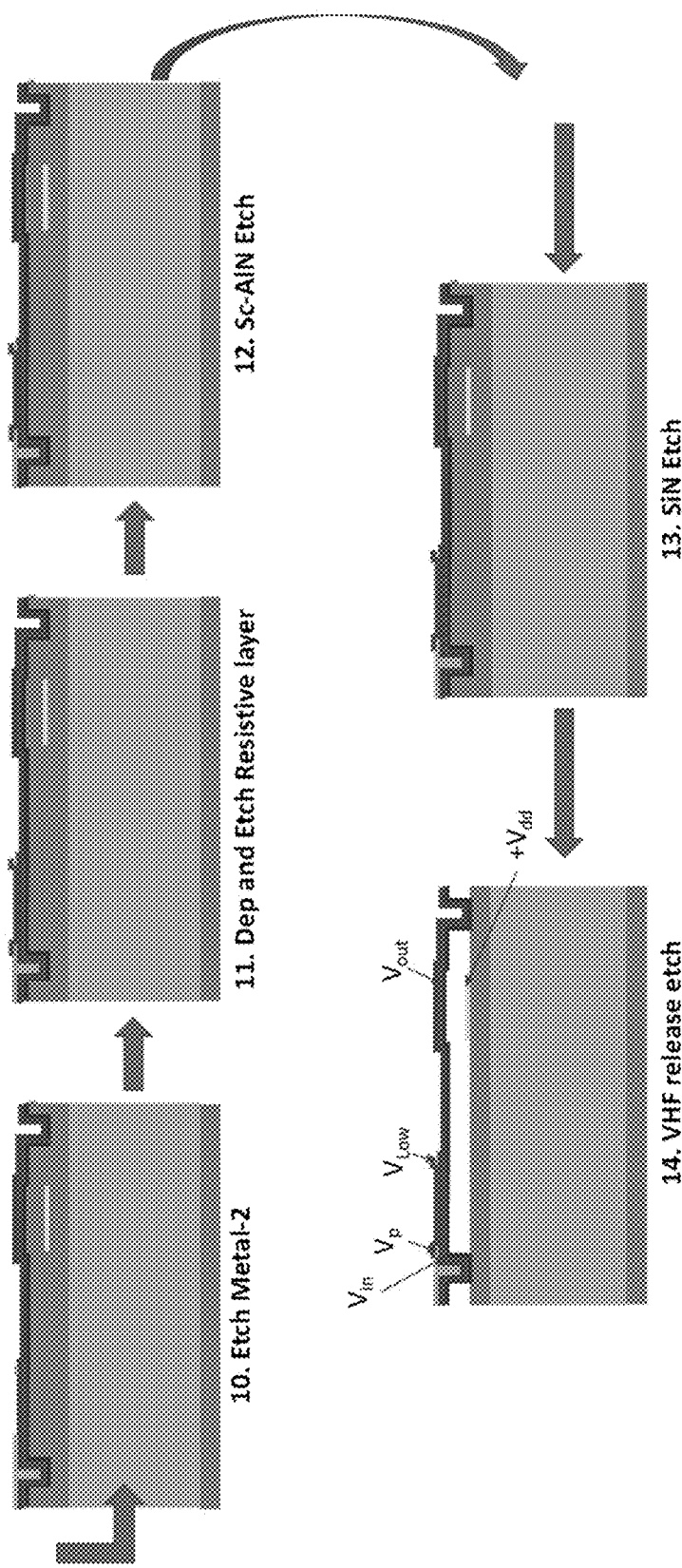

FIG. 13A shows an example of a portion of a process to fabricate the disclosed devices. At step 1, silicon nitride is deposited by a low-pressure chemical vapor deposition (LPCVD) technique (other techniques can also be used). At step 2, metal layer 0 is deposited. At step 3, silicon dioxide is deposited. At step 4, silicon dioxide is etched. At step 5, silicon nitride is deposited over the silicon dioxide of step 4. At step 6, metal 1 is deposited. At step 7, metal 1 is etched. At step 8, Sc—AlN is deposited. At step 9, metal 2 is deposited. FIG. 13B continues the process flow from FIG. 13A. At step 10, metal 2 is etched. At step 11, the resistive layer is deposited and etched. At step 12, Sc—AlN is etched. At step 13, the second silicon nitride layer is etched. At step 14, the structure is released using, for example, a vapor hydrofluoric acid (vHF) etching.

Hafnium Zirconium Oxide (HZO)-Based Ferroelectric NEMS

A hafnium zirconium oxide (HZO)-based ferroelectric NEMS unimorph is disclosed as a building block for very low-energy capacitive readout in-memory computing. A device consistent with the disclosed subject matter includes a 250 μm×30 μm unimorph cantilever with 20 nm thick ferroelectric HZO on 1 μm $SiO_2$. Ferroelectric films can be 1-50 nm for HZO. Ferroelectric films can be thicker for AlScN, lead zirconate titanate (PZT) and other ferroelectric films. Partial ferroelectric switching in HZO achieves analog programmable control of the piezoelectric coefficient ($d_{31}$) which serves as a computational weight for multiply-accumulate (MAC) operations. The displacement of the piezoelectric unimorph can be recorded by actuating the device with different input voltages $V_{in}$. The resulting displacement can be measured as a function of the ferroelectric programming/poling voltage $V_p$. The slopes of central beam displacement ($\delta_{max}$) vs. $V_{in}$ in an example device were measured to be between 182.9 nm/V (for $-8V_p$) and $-90.5$ nm/V (for $8V_p$), demonstrating that $V_p$ can be used to change the direction of motion of the beam. Generally, devices produced with thinner ferroelectric films operate at lower voltages. For example, devices with a thinner ferroelectric film than 20 nm will operate at lower voltages than the example device. In an example device, the resultant $\delta_{max}$ from AC actuation is in the range of $-18$ to 36 nm and is a scaled product of the input voltage and programmed $d_{31}$ (governed by the $V_p$). The multiplication function serves as a unit for MAC operations with a ferroelectric NEMS unimorph. The displacement from multiple beams can be added by summing the capacitance changes for a multi-input and multi-weight neuron. The disclosed device can be CMOS compatible, achieving high in-memory computational throughput.

Neuromorphic computation is of great interest to computing theory and practical implementations due to the potential for low-power, high efficiency, and small form factor information processing with deep neural networks (DNNs). The building blocks of DNNs are perceptron blocks, which require brain-like synaptic functions achieved through arrays of MAC units. With the ever-increasing number of variables required for neuromorphic computation with high accuracy, there is a need to develop energy-efficient device architectures. The energy used per MAC unit is a useful metric to compare various technologies. The disclosed NEMS switches and beams offer zero-leakage in-memory compute synaptic functionality where the beam actuation has embedded programmable weights in the form of tunable capacitive or piezoelectric coupling. While analog in-memory computing has been demonstrated using different architectures the disclosed NEMS-based approach takes advantage of a released beam structure to eliminate energy leakage in an idle state. Disclosed is a ferroelectricipiezoelectric beam transducer enabling multiplication that can be read out capacitively, eliminating any DC currents.

Figure 14:
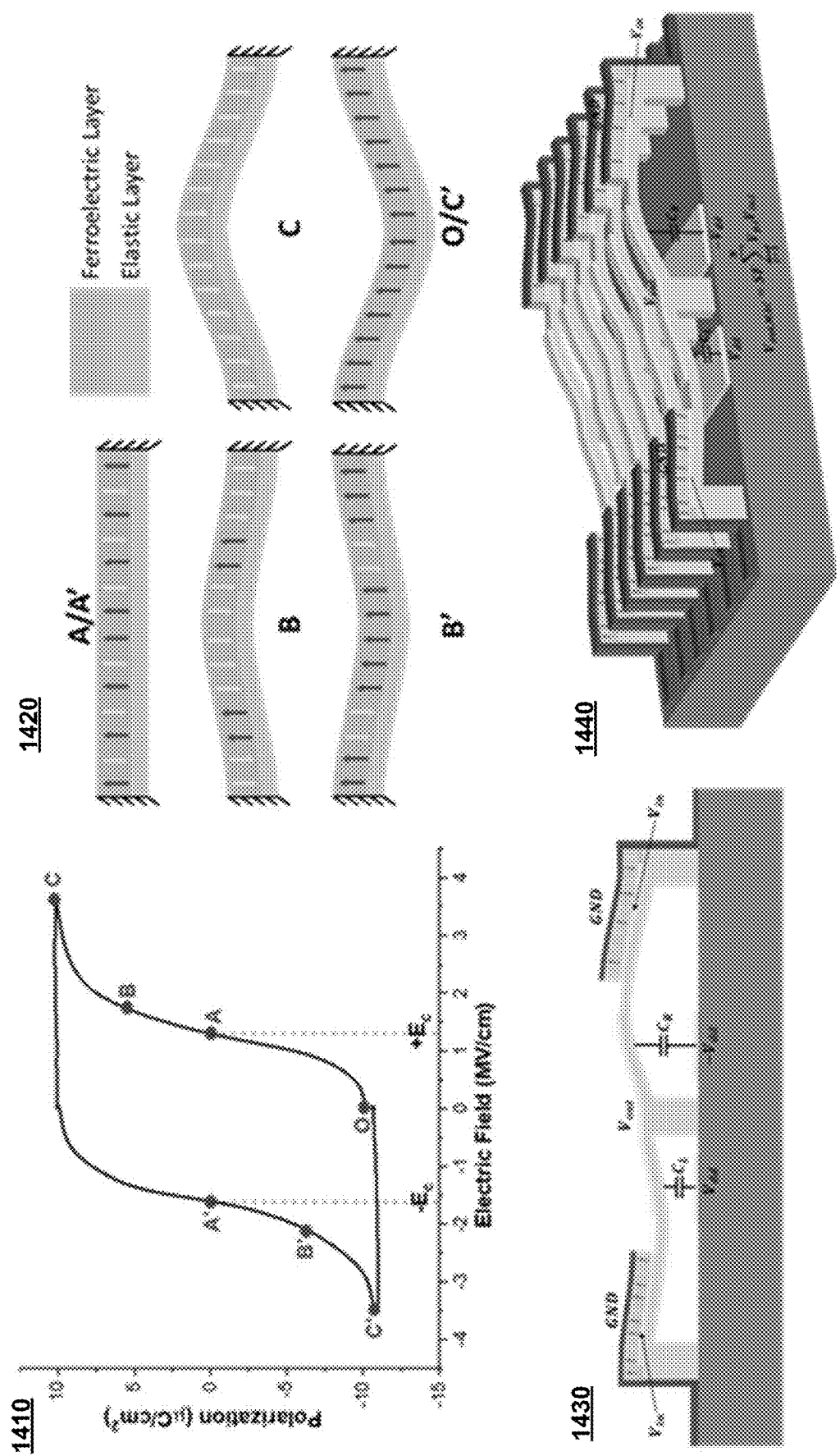
FIG. 14 shows a partial polarization in a ferroelectric for analog control of beam-bending in a unimorph.

The disclosed subject matter provides a technique to store neural net weights in the form of the programmable piezoelectric coefficient $d_{31}$ of HZO-driven unimorph, which changes by applying a polarization switching voltage $V_p$. After polarization programming, different actuation inputs ($V_{in}$) actuate a cantilever such that the unimorph displacement is a scaled product of $V_p$ and $V_{in}$. The displacement can in turn be measured as capacitive sense current from a capacitive divider circuit, for parallel MAC operations from arrays of such NEMS elements. FIG. 14 shows partial polarization in a ferroelectric for analog control of beam-bending in a unimorph. FIG. 14 at 1410 shows a PUND loop of 20 nm-thick HZO film. FIG. 14 at 1420 shows an example polarization-dependent bending moment generated in ferroelectric-on-elastic unimorph at various points along the PE loop ($E_C$ is coercive field) FIG. 14 at 1430 shows a multiplier unit with ferroelectric actuation and capacitive readout. The output voltage is the product of $V_{in}$ and stored weights in the form of $d_{31}$ coefficients. FIG. 14 at 1440 shows several multipliers with capacitive readout can be placed in parallel to form a MAC unit that can perform accumulation operation by summing up the capacitances from each device.

In addition to the active ferroelectric film, the unimorph stack can also include metal contact layers and an insulating elastic layer. The polarization versus E-field (PE loop) for an 80 µm diameter metal-ferroelectric-metal (MFM) capacitor on a 20 nm thin HZO film is shown in FIG. 14 at 1410. Moving counterclockwise along the PE loop starting with all dipoles point downward (point O), the film can be in a state of net-zero polarization (points A and A') at the positive and negative coercive fields, fully down or up-switched (points C and C') or partially polarized (along the slopes of A-B and A'-B'). Each point along the PE loop achieves a specific macroscopic value of $d_{31}$, with the maximum and minimum values at the two extrema (at points C and C') with the appropriate choice of bias voltage $V_p = Et_{HZO}$. After programming, if a much smaller actuation voltage $V_{in}$ is applied such that it produces no dipole switching, an in-plane stress is generated due to expansion or contraction of the HZO film along its length, resulting in the piezoelectric bending moment $M_{Piezo}$. The programming enables weight-storage in DNNs at reduced rates compared to inference events. The beam displacement is a solution of the Euler-Bernoulli equation:

$$\frac{\partial^2 y}{\partial x^2} = -\frac{M_{Piezo}}{C} \qquad \text{EQ. 13}$$

Here, $M_{Piezo}$ is the piezoelectric moment generated due to applied $V_{in}$ and C is the total flexural rigidity of the multilayer piezoelectric stack. By using zero displacements and zero slopes boundary conditions on each end of the clamped-clamped beam, the Euler-Bernoulli equation yields the beam displacement profile. The maximum beam displacement occurs at the center, i.e., $y(L/2) = \delta_{max}$. For piezoelectric coefficient $d_{31}$ and in-plane stress $\sigma_1$ in HZO, the beam displacement can be expressed as:

$$\delta_{max} \propto M_{Piezo} \propto \sigma_1 \propto d_{31} \propto P(\text{Polarization}) \propto V_p \qquad \text{EQ. 14}$$

For an input voltage $V_{in}$, the NEMS beam displacement is a scaled product of weights and inputs.

$$\delta_{max} = SF \cdot V_p \cdot V_{in} \qquad \text{EQ. 15}$$

The scale factor (SF) depends on ferroelectric material properties, beam geometry, Young's modulus, etc. However, using the disclosed techniques the multiplier can be designed to achieve linear behavior in the transfer characteristics curve along the rising and falling slopes of the PE loop to accomplish a multiplicative function for parallel MAC operations. FIG. 14 at 1430 shows an example multiplier unit with a capacitive readout to measure the output voltage. The left and right beams are poled with the same magnitude but with opposite polarity. For the same input voltage $V_{in}$, the left and right beams displace such that the difference between the two represents the product of $V_{in}$ and $V_p$. The differential motion causes differential capacitance between left and right capacitive parallel plates. The output voltage can be expressed as:

$$V_{out} = 2V_{dd}\frac{C_L - C_R}{C_L + C_R} \cong -2V_{dd}\frac{\gamma(x_L - x_R)}{2g} = SF \cdot V_p \cdot V_{in}, \qquad \text{EQ. 16}$$

where $\gamma$ is an constant which depends on beam geometry, and $x_L$ and $x_R$ are left and right parallel plate displacements with initial gap g. Several multiplier units can then be further connected in parallel with an activation unit to form a perceptron. The output voltage of the MAC unit (FIG. 14 at 1440) can be expressed as:

$$V_{out,MAC} = 2V_{dd}\frac{\sum_{i=1}^{N} C_{L,i} - \sum_{i=1}^{N} C_{R,i}}{\sum_{i=1}^{N} C_{L,i} + \sum_{i=1}^{N} C_{R,i}} = SF\sum_{i=1}^{N} V_{p,i} \cdot V_{in,i} \qquad \text{EQ. 17}$$

Figure 15:
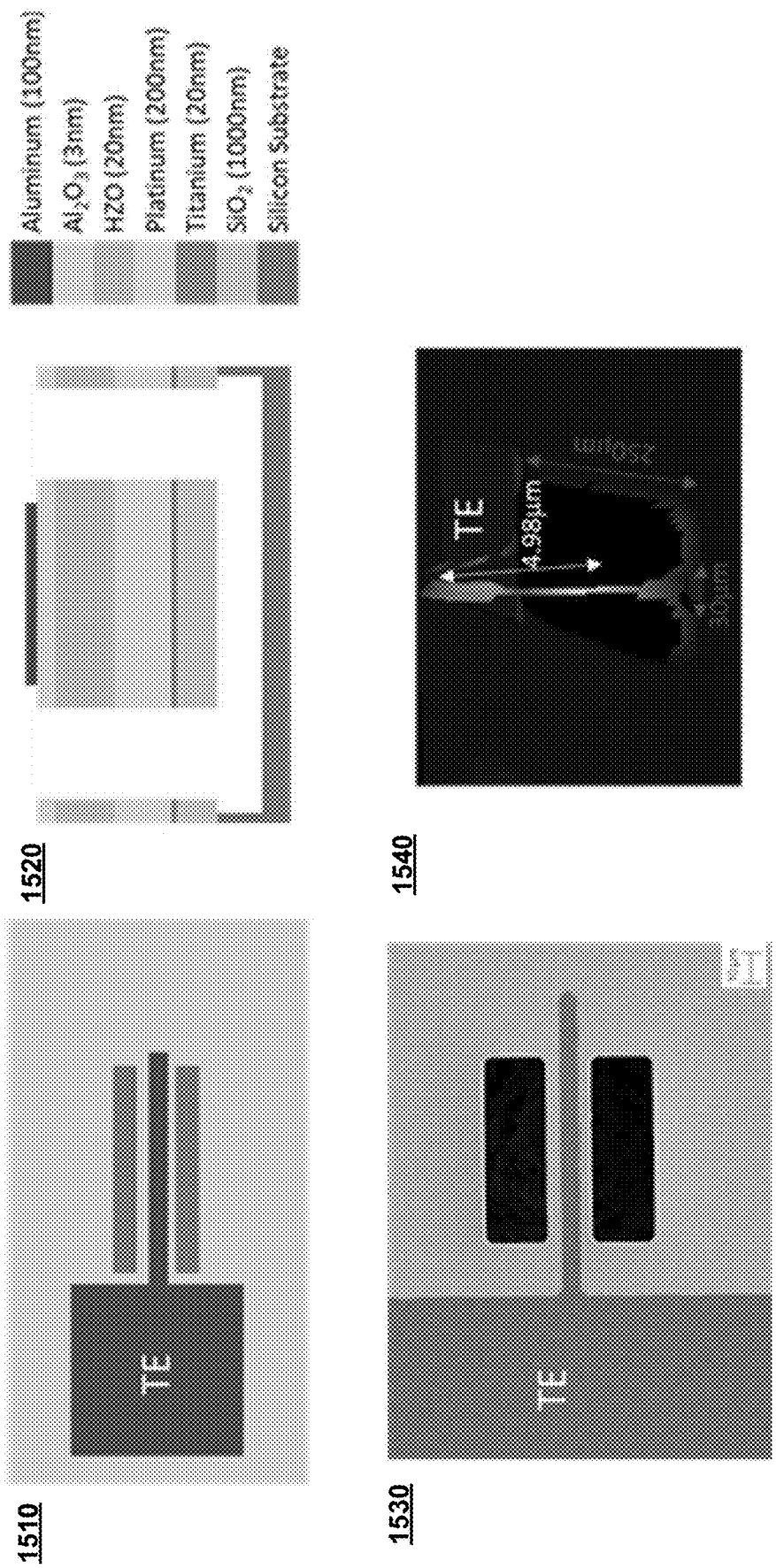
FIG. 15 shows example schematic top and cross-section view of a ferroelectric beam, a SEM image of the beam showing released structure and a 3D profile of the released beam.

FIG. 15 at 1510 and 1520 show top and cross-sectional views of the clamped-clamped ferroelectric unimorph used to demonstrate piezoelectric coefficient programming. 1 µm thick thermal $SiO_2$ forms the elastic layer underneath 20 nm ferroelectric HZO. In some example embodiments, the HZO is capped by 3 nm of alumina ($Al_2O_3$), followed by annealing at 400° C. to crystallize the HZO in its ferroelectric orthorhombic phase, 200 nm platinum (Pt) and 100 nm aluminum (Al) can be deposited to form the bottom and top metal contacts for the HZO respectively. The beam can be released by isotropic etching of the silicon substrate using Xactix $XeF_2$ etcher, or another etcher. A scanning electron microscope image of an example fabricated device is shown in FIG. 15 at 1520. After release, the beams can be observed to be buckled due to residual film-stress generated during microfabrication. A 3D optical profilometer (Zygo™ system) was used to measure the beam buckling profile (FIG. 15 at 1540). In an example device, the maximum displacement for a 250 µm×30 µm was 4.98 µm.

HZO ferroelectric characterization can be performed using a Sawyer-Tower circuit configuration with continuous wave (CW) positive-up-negative-down (PUND) input waveforms to extract the coercive field (Ec) and remnant polarization ($P_r$). Electrical breakdown can be determined under a top metal pad to contact the bottom electrode with 5-10Ω resistance. In an example, the PUND input signal has 83 μs rise, fall, and wait times (corresponding to 1 kHz PUND frequency), and a peak-to-peak amplitude of 15V.

Figure 16B:
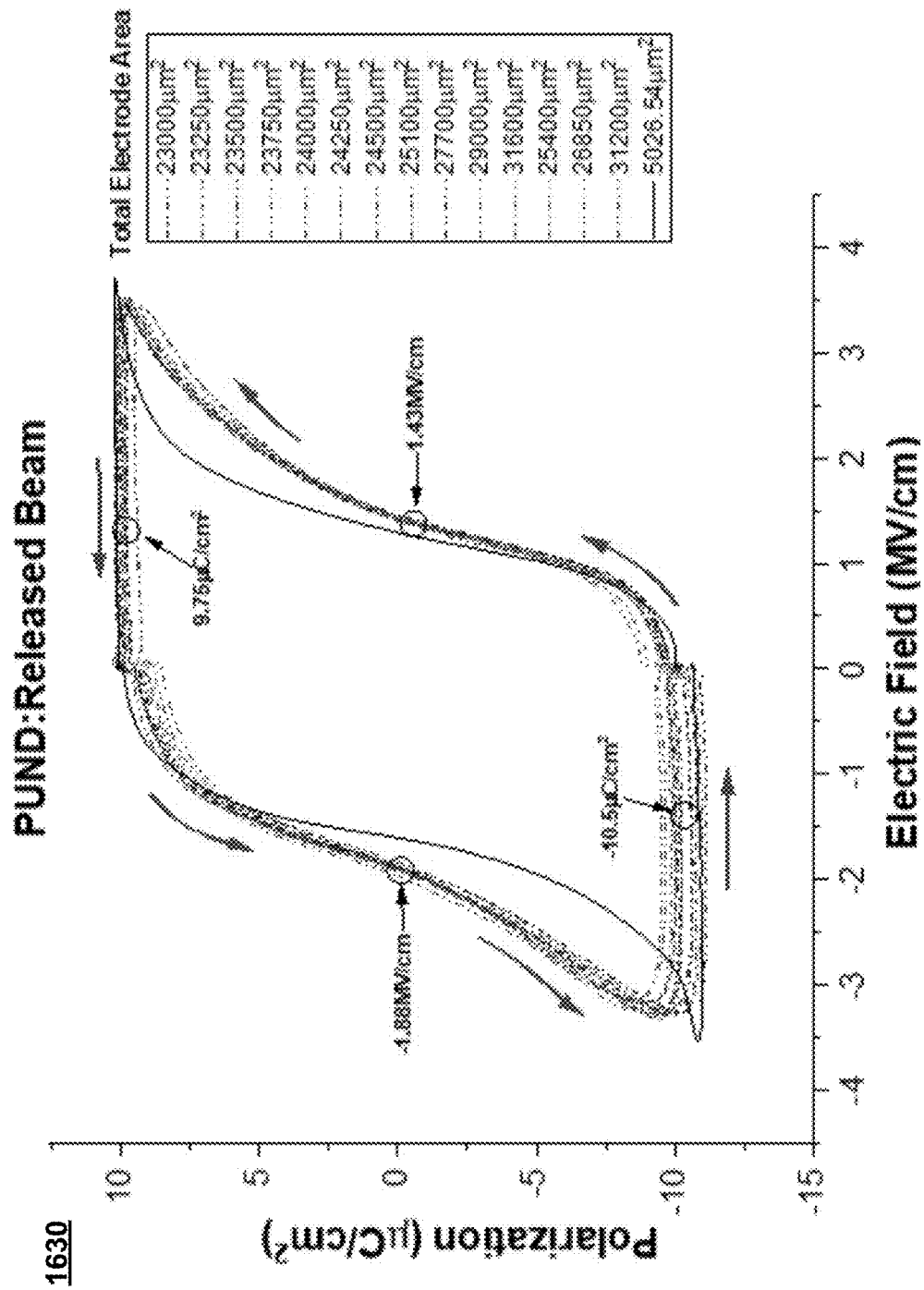
FIG. 16B shows an example of measured polarization vs. E-field characteristics of released beam devices with different lengths and widths showing repeatability.
Figure 16C:
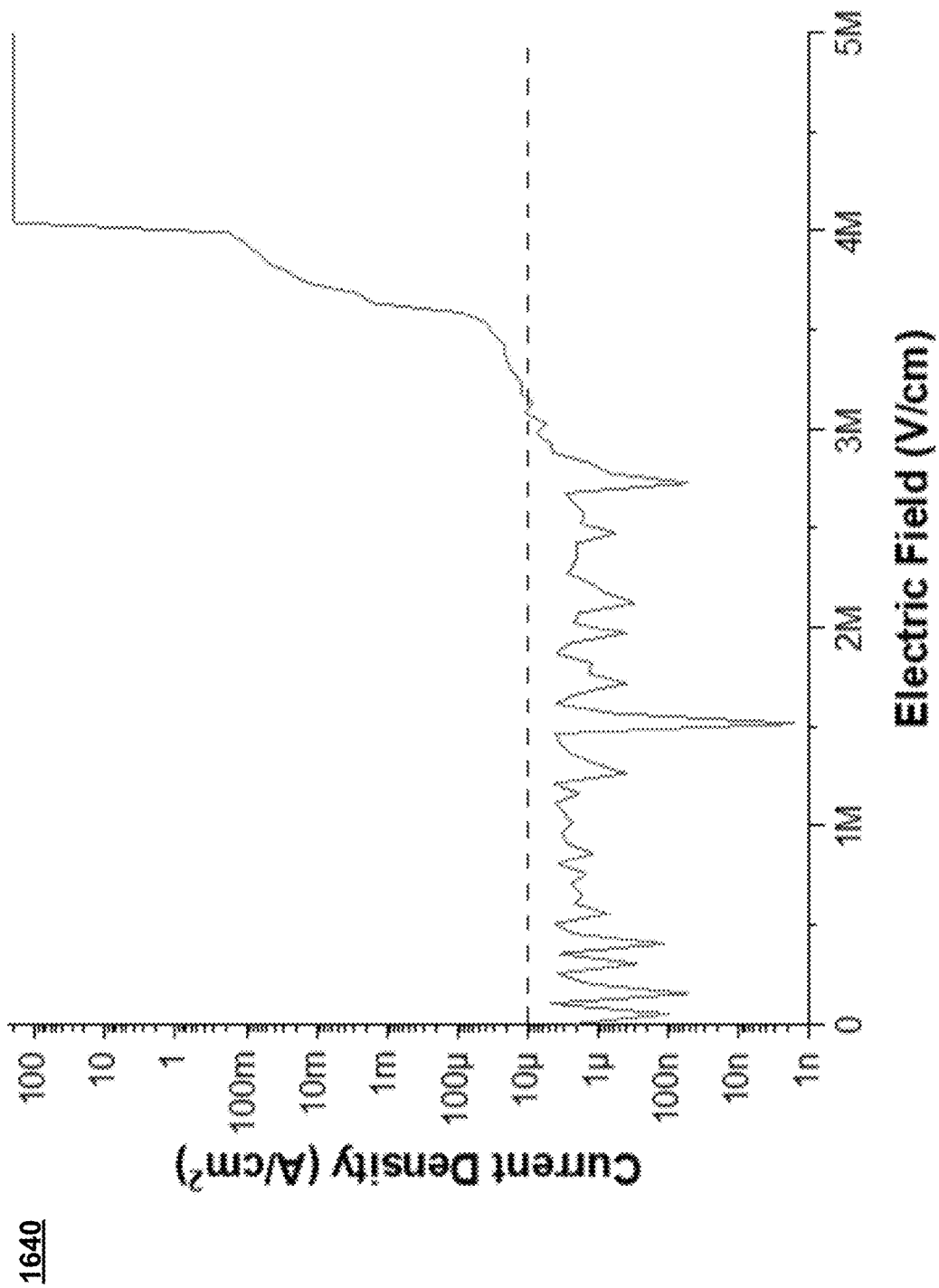
FIG. 16C shows a DC I-V characteristic of an example device showing high current density.

FIG. 16A at 1610 shows an example time-domain input voltage and output sense current measured with an 11.8 kΩ sense resistor. The P and N pulses show a switching current peak below the peak voltage, indicative of polarization switching, whereas the U and D pulses show capacitive displacement current and low leakage. This confirms ferroelectricity in the released HZO films without any degradation, consistent over 10,000 cycles of switching with CW operation, FIG. 16A at 1620 shows example plots of the switching current density (J) vs. E-field. The PUND measurement was performed on multiple such released NEMS beams with a range of lengths from 100-400 μm and widths spanning 15-39 μm. The overlay from these measurements is shown with multiple dotted lines in FIG. 16B at 1630. For comparison, the PUND loop for an unreleased 80 μm diameter circular electrode is also shown on the same plot (solid black line). This shows that there is little/no degradation of ferroelectric properties of the HZO before and after release. Multiple release devices with different electrode sizes had overlapping loops suggesting high repeatability. PUND measurements yield an extracted $E_c \approx 1.5$ MV/cm and $P_r \approx 10$ μC/cm$^2$, consistent with previously reported values. The devices were also tested for DC breakdown as shown in FIG. 16C at 1640. In the example device, the device's current density exceeds 10 μA/cm$^2$ at 3.15 MV/cm.

Using the disclosed technology, analog weights can be stored in the bending motion of the NEMS beam for in-memory computation, which relies on the programming of the $d_{31}$ coefficient of the device by using different poling voltages. A test methodology that can be used is as follows:

Step 1: Device poling with CW single-sided pulses at 3 kHz. The configuration used for poling is depicted in FIG. 16A at 1610 (inset). A test signal is applied to the top electrode, and the ground connection is made to the bottom electrode by breaking down the HZO under a large top metal pad to short it to the bottom electrode.

Step 2: Beam actuation with a small $V_{in}$ to measure the displacement amplitude, without additional polarization switching.

Step 3: Increase poling voltage by 0.5V and repeat steps 1-2, while tracing the PE loop counterclockwise from 0V→8V→0V→-8V→0V.

This voltage sweep for $V_p$ is similar to the PUND loop except in this technique, the $V_p$ can be stepped by 0.5V and then the beam displacement measured with a fixed $V_{in}$ amplitude, unlike the PUND measurements in CW operation with increasing voltages.

Figure 17A:
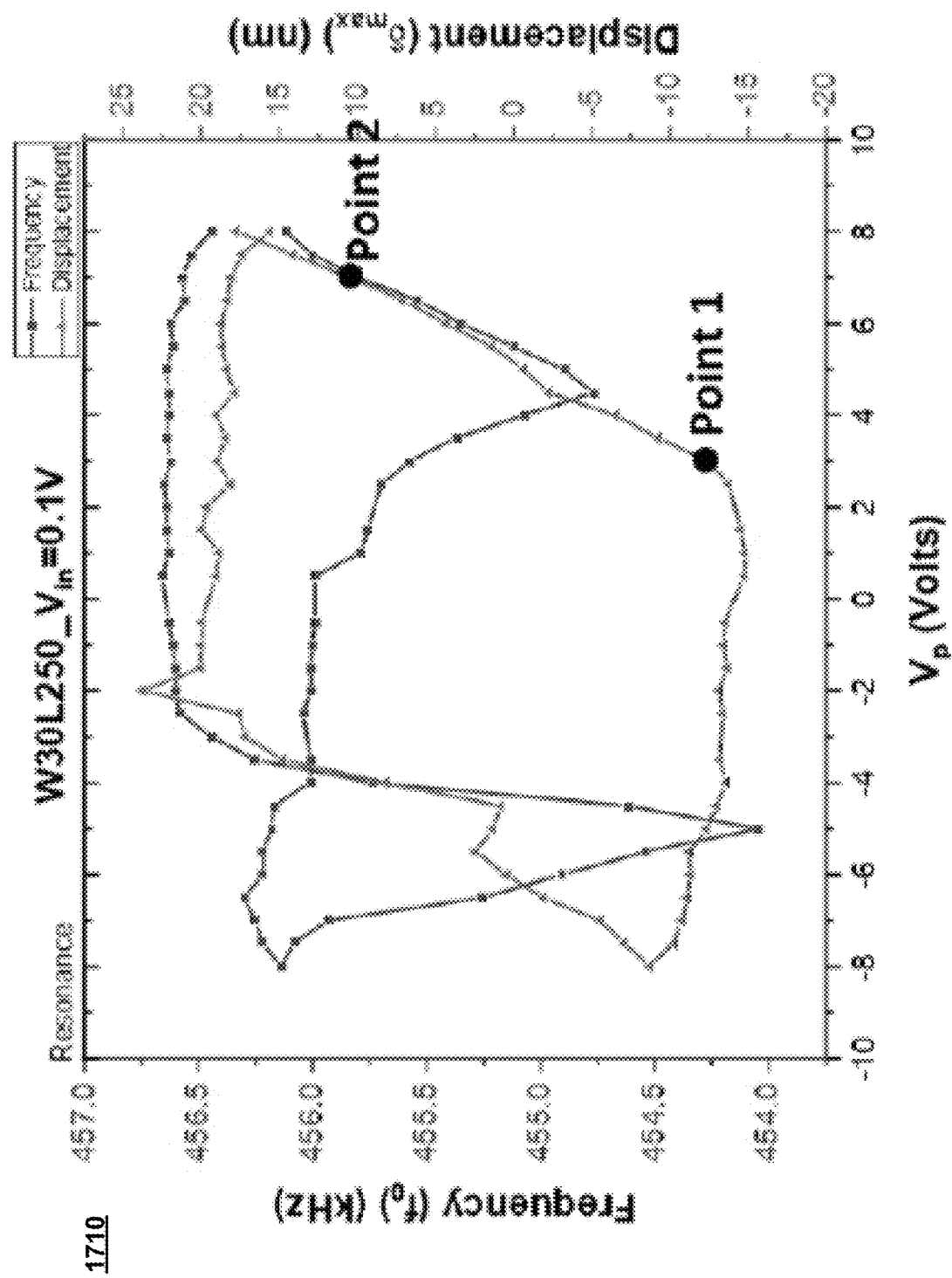
FIG. 17A shows an example of central beam displacement $\delta_{max}$ and resonant frequency $f_0$ vs. poling voltage $V_p$ plot.

A Polytec MSA-400 laser doppler vibrometer (LDV) can be used to measure the beam motion. For an example 250 μm×30 μm beam, a 0.1V amplitude frequency chirp from 1 kHz to 1 MHz was applied. A resonance at $f_0$=455.23 kHz was identified with a quality factor of 305. AC voltage $V_{in}$=0.1V was used to measure peak amplitudes. FIG. 17A shows the peak beam displacement $\delta_{max}$ and resonant frequency $f_0$ vs. poling voltage $V_p$ plot for the nominal 250 μm×30 μm ferroelectric clamped-clamped beam. $\delta_{max}$ (red line) is modulated for different values of $V_p$ and traces a hysteresis loop, similar to the PE loop from PUND measurements. The net effect of the number of upward and downward pointing dipoles that control the macroscopic polarization in the beam (induced due to $V_p$) also changes the beam stiffness resulting in resonance frequency modulation (black line), which presents a separate modality of weight storage in the beam. The two dips in $f_0$ correspond to the positive and negative coercive fields of the HZO film, where the net polarization is almost zero. As illustrated in FIG. 14 at 1420, domain randomization is a potential cause for likely film relaxation at these points causing $f_0$ to drop.

Figure 17B:
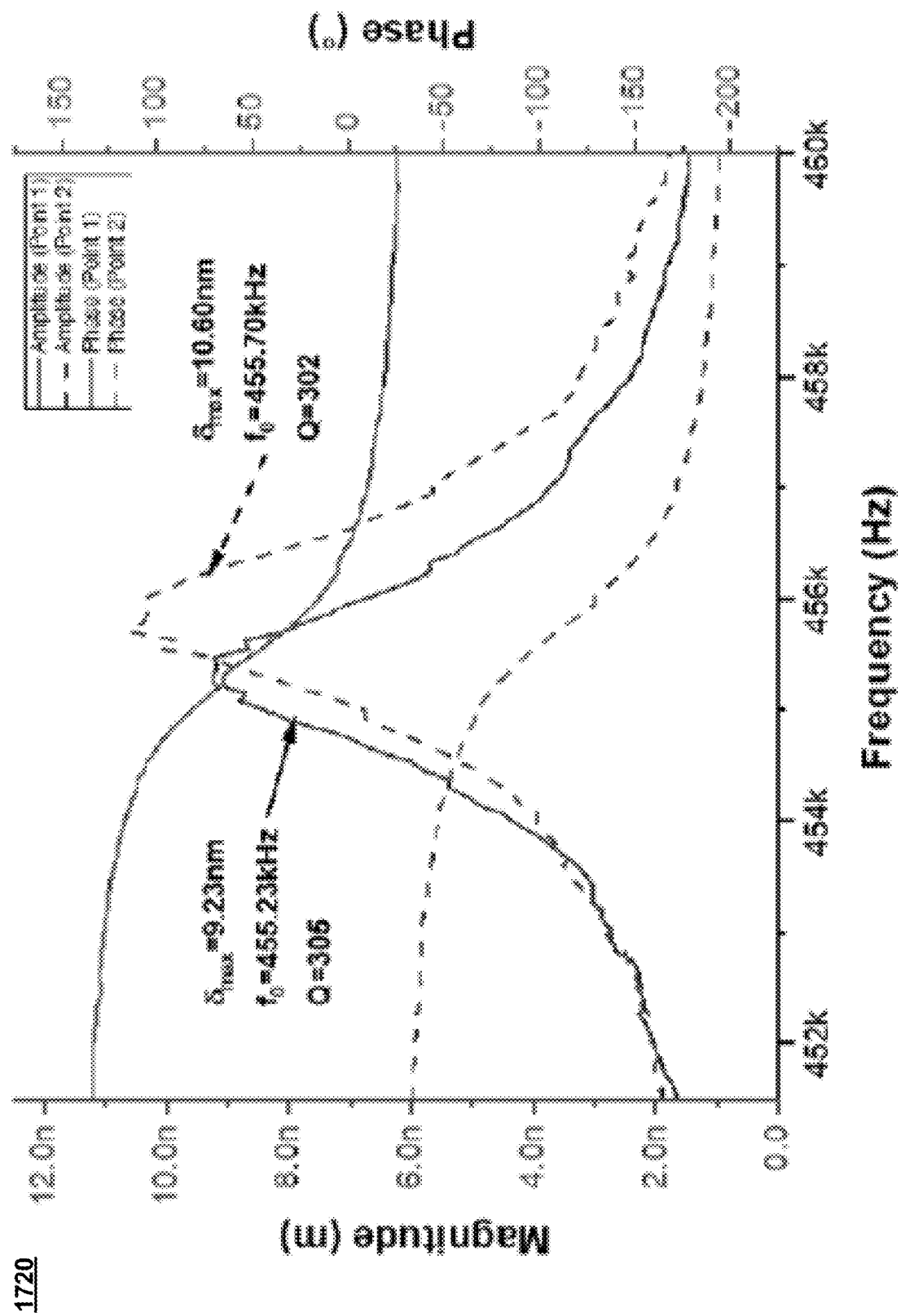
FIG. 17B shows an example of resonance vibration magnitude and phase plots of the same beam at different points in FIG. 17A.

From FIG. 17A at 1710, the positive linear dependence of $\delta_{max}$ can be seen in the voltage interval 2.5V→8V. Similarly, negative linear dependence in the interval -2.5V→-8V. Here, the slope of $\delta_{max}$ vs. $V_p$ is SF×$V_{in}$ as defined in Eq. 15. The effect of $V_{in}$ on $\delta_{max}$ is explained in the next section. Two points were selected on the positive slope to show the resonance vibration magnitude and phase plots of the vibrating beam (FIG. 17B at 1720). Points 1 and 2 have almost the same displacement magnitude but exactly opposite phases. This 180° phase difference is a signature of polarization inversion corresponding to a sign change for $\delta_{max}$. To show the effect of $V_{in}$ on $\delta_{max}$, $V_{in}$ was swept from 0.02V to 0.20V for different values of the $V_p$ (FIG. 18).

Figure 18:
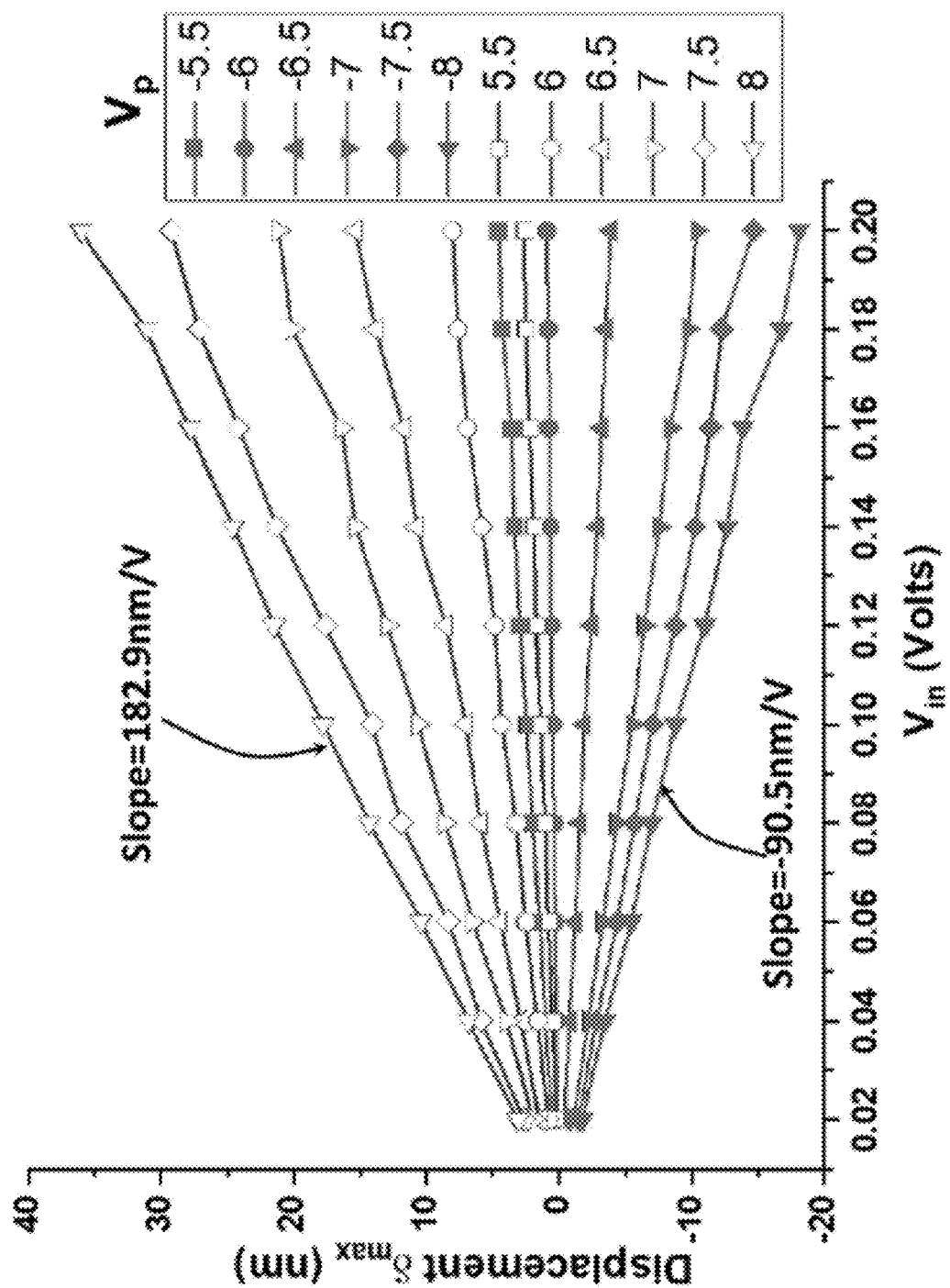
FIG. 18 shows an example of displacement vs. $V_{in}$ for different values of $V_p$.

FIG. 18 shows an example plot of $\delta_{max}$ vs. $V_{in}$ at different values of $V_p$ which emulates the transfer characteristics of the analog multiplier. For a fixed poling voltage, an input voltage sweep yields a linear increase in displacement value. Similarly, for constant inputs, different poling voltages outputs different displacement values. The scale factor can be calculated from measured data and the commensurate plots as follows:

$$SF = \frac{\delta_{max}}{V_p V_{in}} \qquad \text{EQ. 18}$$

Eq. 18 demonstrates that $\delta_{max}$ is the product of inputs ($V_{in}$) and weights ($V_p$). As shown in FIG. 17A and FIG. 18, Eq. 18 behaves linearly in the range of $V_p$ from ±2.5V to ±8V and $V_{in}$ from 0 to 0.2V for the device tested here (250 μm×30 μm beam). The beam displacement can be measured using a capacitive divider circuit to measure $V_{out}$. The slope of the plot in FIG. 18 is the experimental SF×$V_p$. For $V_p$=±8V, the measured slopes were 182.9 nm/V and -90.5 nm/V respectively. The asymmetry in the negative and positive $V_p$ slopes is likely due to the non-symmetric device stack. In this example, there is a very thin top electrode (Al) above HZO and, below HZO a thick SiO$_2$ and electrode (Pt) stack. Thus, for the same $V_p$, actuation with opposite polarity will have an unequal effect on the partial polarization resulting in different $\delta_{max}$ values.

The disclosed HZO-based NEMS multiplier has been demonstrated with weight storage functionality. The device was fabricated and characterized showing the dependence of beam displacement on the poling voltage of the ferroelectric film. Polarization-dependent frequency-tuning was also observed, which can be further explored to achieve an electrically reconfigurable filter. For a 250 μm×30 μm beam poled at 8V, $\delta_{max}$ of 18 nm and $f_0$ of 455.23 kHz with Q=305 was measured. The $\delta_{max}$ vs. $V_{in}$ plot at different values of $V_p$ demonstrate the successful operation of an analog NEMS multiplier. While in the above examples an AC drive was used to obtain observable displacements, DC input voltages can also be used, such as for DNN applications. A capacitive readout of the beam motion can be used instead of the optical readout.

The dimensional and voltage scaling of the prototype device demonstrated is important for CMOS-integrated adoption while maximizing computational throughput. For CMOS compatibility, <1V operation is necessary. This can set an upper bound for HZO film thickness of <7 nm for $E_C$=1.5 MV/cm. Non-resonant actuation of the devices would require a settling time of ~2 $QT_0$. Assuming two operations per device, multiplication and addition, the computation speed (FLOPS per device) and power consumption can be estimated as $f_0/Q$ and $Ef_0/Q$ respectively. Where E is the energy consumption per operation for individual device given by ½$C_{HZO}\cdot V_{in}^2$. For example, a unimorph device of size 5×0.5 μm and thickness 28 nm (~4×HZO thickness) with a Q=10, which can be realized by high-pressure gas damping, yields $f_0$ ~20 MHz and computation speed of 2 MFLOPS/device. Considering driving electrodes of size 1×0.3 μm with 7 nm thick HZO between $V_{in}$ (0.1V) and GND electrodes, the energy consumption per operation can be calculated as ~500 aJ (E=½$C_{HZO}\cdot V_{in}^2$). Combining both values result in 2 PFLOPS/watt computational performance. This computation speed with ultra-low energy consumption and zero leakage current will pave the path toward computation efficiency comparable with that of the efficiency of energy used in the human brain.

As used herein, unless otherwise specified, voltages such as a "first input voltage," a "second input voltage," a "third input voltage," and a "fourth input voltage," etc. can have different magnitudes or one or more can have the same voltage. For example, a first input voltage and a third input voltage can have the same magnitude and/or a second input voltage and a fourth input voltage can have the same magnitude. In another example, the first input voltage and the third input voltage are different magnitudes and/or the second input voltage and the fourth input voltage are different magnitudes.

While this document contains many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed such as, but not limited to, the additional examples set forth below.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

In Example 1, a ferroelectric apparatus, comprises right and left structural beams, right and left input electrodes disposed on first top portions of the right and left structural beams, an output electrode positioned between the right and left input electrodes, right and left ferroelectric films disposed on second top portions of the right and left input electrodes and right and left resistive layers disposed on third top portions of the ferroelectric films, wherein a first electrode is positioned at a first end of each resistive layer and a second electrode is positioned at a second end of each resistive layer.

In Example 2, for the ferroelectric apparatus of Example 1, ferroelectric domains of the right ferroelectric film are changed by application of voltage between the right input electrode and the right first and right second electrodes, and ferroelectric domains of the left ferroelectric film are changed by application voltage between the left input electrode and the left first and second electrodes.

In Example 3, for the ferroelectric apparatus of Example 1 or Example 2, the ferroelectric domains are changed along a length of the right or left ferroelectric layer by the application of a voltage gradient across the right or left resistive films, respectively.

In Example 4, for the ferroelectric apparatus of any of Examples 1-3, a weight is permanently stored in the right or left ferroelectric film after application of a predetermined voltage gradient across the right or left ferroelectric film.

In Example 5, for the ferroelectric apparatus of any of Examples 1-4, a first voltage is applied to the right and left input electrodes and a second voltage is applied to the first electrodes of the right and left resistive layers, and an output voltage at the output electrode is represented by a multiplication of the first voltage and the second voltage.

In Example 6, for the ferroelectric apparatus of any of Examples 1-5, the right and left ferroelectric films store values in a mechanical deformation in one or more of the right and left structural beams, and wherein the values depend on voltages at the right and left input electrodes and at the first and second electrodes.

In Example 7, for the ferroelectric apparatus of any of Examples 1-6, the ferroelectric film is a scandium (Sc)-aluminum nitride (AlN) (Sc—AlN) ferroelectric film.

In Example 8, for the ferroelectric apparatus of any of Examples 1-7, the ferroelectric film has a thickness between about 100 nm and about 300 nm.

In Example 9, for the ferroelectric apparatus of any of Examples 1-8, the right and left structural beams comprise silicon nitride (Si3N4).

In Example 10, for the ferroelectric apparatus of any of Examples 1-9, the right and left structural beams have lengths between about 5 microns and 50 microns, and wherein the right and left structural beams have widths between 1 micron and 10 microns.

In Example 11, a method of fabricating a ferroelectric device comprises the acts of depositing a first silicon nitride layer, depositing metal layer 0 over the first silicon nitride layer, depositing a silicon dioxide layer over metal layer 0, etching the silicon dioxide layer, depositing a second silicon nitride over the silicon dioxide layer, depositing a metal 1 layer, etching the metal 1 layer, depositing a Sc—AlN layer, depositing a metal 2 layer, etching the metal 2 layer, depositing a resistive layer, and etching the Sc—AlN layer.

In Example 12, the method of fabricating a ferroelectric device according to Example 11 further comprises etching the second silicon nitride layer and etching to release a structure including structural beams.

In Example 13, a method of fabricating a ferroelectric device comprises the acts of depositing a first silicon nitride layer, depositing metal layer 0 over the first silicon nitride layer, depositing a silicon dioxide layer over metal layer 0, etching the silicon dioxide layer, depositing a second silicon nitride over the silicon dioxide layer, depositing a metal 1 layer, etching the metal 1 layer, depositing ferroelectric material layer, depositing a metal 2 layer, etching the metal 2 layer, depositing a resistive layer, and etching the ferroelectric material layer.

In Example 14, the method of fabricating a ferroelectric device according to Example 13 further comprises etching the second silicon nitride layer and etching to release a structure including structural beams.

In Example 15, the method of fabricating a ferroelectric device according to Example 13 or Example 14, wherein the ferroelectric material layer comprises at least one of AlScN, HZO, or PZT.

In Example 16, a ferroelectric nanoelectromechanical system (ferroelectric NEMS), comprises a first structural beam, having a proximal end and a distal end, at least the proximal end being supported or fixed. The ferroelectric NEMS further comprises a first input electrode having a first side and a second side, a first side of the first input electrode disposed on a first portion of the first structural beam, adjacent the proximal end, on a first side of the first structural beam. The ferroelectric NEMS further comprises a first ferroelectric film disposed on the second side the first input electrode, a first resistive layer disposed a central portion of the first ferroelectric film, and a first electrode disposed adjacent a first lateral portion of the first ferroelectric film adjacent the proximal end. The ferroelectric NEMS further comprises a second electrode disposed adjacent a second lateral portion of the first ferroelectric film opposite the first lateral portion, a first output electrode disposed on a second portion of the first structural beam that is spaced apart from the first portion and that is on the first side of the first structural beam and a first terminal electrode disposed adjacent to the second portion of the first structural beam and spaced apart from a second side of the first structural beam by a gap, the second side of the first structural beam being a side opposite to the first side of the first structural beam, wherein, upon application of a first input voltage to the first input electrode and a second input voltage to the second electrode, the second portion of the first structural beam is displaced relative to the proximal end.

In Example 17, the ferroelectric NEMS according to Example 16, further comprises a second structural beam, having a proximal end and a distal end, at least the proximal end being supported or fixed, and a second input electrode having a first side and a second side, a first side of the second input electrode disposed on a first portion of the second structural beam, adjacent the proximal end, on a first side of the second structural beam, the first side of the second structural beam corresponding to a same side as the first side of the first structural beam. The ferroelectric NEMS further comprises a second ferroelectric film disposed on the second side of the second input electrode, a second resistive layer disposed a central portion of the second ferroelectric film, a third electrode disposed adjacent a first lateral portion of the second ferroelectric film adjacent the proximal end, a fourth electrode disposed adjacent a second lateral portion of the second ferroelectric film opposite the first lateral portion, a second output electrode having a first side and a second side, a first side of the second output electrode disposed on a second portion of the second structural beam that is spaced apart from the first portion and that is on the first side of the second structural beam and a second terminal electrode disposed adjacent to the second portion of the first structural beam and spaced apart from a second side of the first structural beam by a gap, the second side of the first structural beam being a side opposite to the first side of the first structural beam, wherein, upon application of a first input voltage to the second input electrode and a second input voltage to the third electrode, the second portion of the second structural beam is displaced relative to the proximal end.

In Example 18, for the ferroelectric NEMS according to Example 16 or Example 17, the distal end of the first structural beam is connected to the distal end of the second structural beam, the distal end of the first structural beam and the distal end of the second structural beam are each connected to an intermediate structural member, or the first structural beam and the second structural beam are opposing lateral portions of a unitary structural member.

In Example 19, for the ferroelectric NEMS according to any of Examples 16-18, the first output electrode and the second output electrode are a common output electrode.

In Example 20, for the ferroelectric NEMS according to any of Examples 16-19, a ferroelectric domain of the first ferroelectric film is changed by application of voltage between the first input electrode and the first and second electrodes and a ferroelectric domain of the second ferroelectric film is changed by application of voltage between the second input electrode and the third and fourth electrodes.

In Example 21, for the ferroelectric NEMS according to any of Examples 16-20, the ferroelectric domains are changed along a length of the respective ferroelectric film by the application of a voltage gradient across the respective resistive layer.

In Example 22, for the ferroelectric NEMS according to any of Examples 16-21, a weight value corresponding to a selected voltage is stored in a selected ferroelectric film after application of a predetermined voltage gradient across the ferroelectric film.

In Example 23, for the ferroelectric NEMS according to any of Examples 16-22, responsive to application of a first input voltage to the first input electrode and application of a second input voltage to the second electrode on the first resistive layer and responsive to application of the first input voltage to the second input electrode and application of the second input voltage to the third electrode on the second resistive layer, an output voltage at the common output electrode is represented by a second output voltage. In Example 23, the first output voltage and the second output voltage, collectively, represent by a multiplication of the first input voltage and the second input voltage.

In Example 24, for the ferroelectric NEMS according to any of Examples 16-23, the first ferroelectric film is selectively biased in a selected direction by application of a selected voltage across the first electrode and the second electrode to cause the deformation of the first structural beam and the displacement of the first structural beam store is maintained until application of a different selected voltage across the first electrode and the second electrode.

In Example 25, for the ferroelectric NEMS according to any of Examples 16-24, the ferroelectric film comprises at least one of AlScN, HZO, or PZT.

In Example 26, for the ferroelectric NEMS according to any of Examples 16-25, the first ferroelectric film has a thickness between about 1-50 nm for HZO or a thickness greater than 50 nm for AlScN or PZT, and optionally between about 100-300 nm for AlScN or PZT.

In Example 27, for the ferroelectric NEMS according to any of Examples 16-26, wherein the first structural beam comprises at least one of silicon nitride ($Si_3N_4$), silicon-dioxide, or aluminum nitride.

In Example 28, for the ferroelectric NEMS according to any of Examples 16-27, the first structural beam and the second structural beam each have a length between about 200 nm and 50 microns, and wherein the first structural beam and the second structural beam each have a width between about 1 micron and about 10 microns, or have a width above 10 microns.

In Example 29, a ferroelectric nanoelectromechanical circuit comprises an array of ferroelectric nanoelectromechanical elements, each ferroelectric nanoelectromechanical element in the array comprises a structural beam supported or fixed at a first end and supported or fixed at a second end and a first input electrode having a first side and a second side, a first side of the first input electrode disposed on a first portion of the structural beam, adjacent the first end, on a first side of the structural beam. Each ferroelectric nanoelectromechanical element further includes a first ferroelectric film disposed on the second side the first input electrode, a first resistive layer disposed a central portion of the first ferroelectric film, a first electrode disposed adjacent a first lateral portion of the first ferroelectric film adjacent the first end of the structural beam, a second electrode disposed adjacent a second lateral portion of the first ferroelectric film opposite the first lateral portion and a first terminal electrode disposed adjacent to a central portion of the structural beam, closer to the first end of the structural beam than the second end of the structural beam, and spaced apart from a second side of the structural beam by a gap, the second side of the structural beam being a side opposite to the first side of the structural beam. Each ferroelectric nanoelectromechanical element further includes a second input electrode having a first side and a second side, a first side of the second input electrode disposed on a second portion of the structural beam, adjacent the second end, on the first side of the structural beam and further includes a second ferroelectric film disposed on the second side of the second input electrode, a second resistive layer disposed a central portion of the second ferroelectric film, a third electrode disposed adjacent a first lateral portion of the second ferroelectric film adjacent the second end of the structural beam, a fourth electrode disposed adjacent a second lateral portion of the second ferroelectric film opposite the first lateral portion and a second terminal electrode disposed adjacent to a central portion of the structural beam, closer to the second end of the structural beam than the first end of the structural beam, and spaced apart from a second side of the structural beam by a gap, the second side of the structural beam being a side opposite to the first side of the structural beam. Each ferroelectric nanoelectromechanical element further includes an output electrode disposed in a central portion of the structural beam, on the first side of the structural beam, between and spaced apart from the first input electrode and the second input electrode. Upon application of a first input voltage to the first input electrode and a second input voltage to the second electrode and/or upon application of a third input voltage to the second input electrode and a fourth input voltage to the third electrode, at least a portion of the structural beam adjacent the output electrode is biased to move from a first position to a second position to change an electrical state of the ferroelectric nanoelectromechanical element.

In Example 30, each ferroelectric nanoelectromechanical element in the array of Example 29 comprises a ferroelectric domain of the first ferroelectric film is changed by application of voltage between the first input electrode and the first and second electrodes and a ferroelectric domain of the second ferroelectric film is changed by application of voltage between the second input electrode and the third and fourth electrodes.

In Example 31, each ferroelectric nanoelectromechanical element in the array of any of Example 29 or Example 30, comprises ferroelectric domains that are changed along a length of the respective ferroelectric film by the application of a voltage gradient across the respective resistive layer.

In Example 32, each ferroelectric nanoelectromechanical element in the array of any of Examples 29-31 comprises a weight value corresponding to a selected voltage stored in a selected ferroelectric film after application of a predetermined voltage gradient across the ferroelectric film.

In Example 33, each ferroelectric nanoelectromechanical element in the array of any of Examples 29-31, responsive to application of a first input voltage to the first input electrode and application of a second input voltage to the second electrode on the first resistive layer and responsive to application of the first input voltage to the second input electrode and application of the second input voltage to the third electrode on the second resistive layer, an output voltage at the common output electrode is represented by a second output voltage. In Example 33, the first output voltage and the second output voltage, collectively, represent by a multiplication of the first input voltage and the second input voltage.

In Example 34, for each ferroelectric nanoelectromechanical element in the array of any of Examples 29-31, the first ferroelectric film is selectively biased in a selected direction by application of a selected voltage across the first electrode and the second electrode to cause the deformation of the structural beam and the displacement of the structural beam store is maintained until application of a different selected voltage across the first electrode and the second electrode.

In Example 35, for each ferroelectric nanoelectromechanical element in the array of any of Examples 29-34, the ferroelectric film comprises at least one of AlScN, HZO, or PZT.

In Example 36, for each ferroelectric nanoelectromechanical element in the array of any of Examples 29-35, the first ferroelectric film has a thickness between about 1-50 nm for HZO or a thickness greater than 50 nm for AlScN or PZT, and optionally between about 100-300 nm for AlScN or PZT.

In Example 37, for each ferroelectric nanoelectromechanical element in the array of any of Examples 29-36, the structural beam comprises at least one of silicon nitride ($Si_3N_4$), silicon-dioxide, or aluminum nitride.

In Example 38, for each ferroelectric nanoelectromechanical element in the array of any of Examples 29-37, the structural beam having a length between about 10-100 microns, and wherein the structural beam has a width between about 1 micron and about 10 microns, or have a width above 10 microns, but less than a length.

What is claimed is:

1. A ferroelectric nanoelectromechanical apparatus, comprising:
   a first structural beam;
   a first input electrode disposed on a first top portion of the first structural beam;
   an output electrode;
   a first ferroelectric film disposed on a second top portion of the first input electrode; and
   a first resistive layer disposed on a third top portion of the first ferroelectric film, wherein a first electrode is positioned at a first end of the first resistive layer and a second electrode is positioned at a second end of the first resistive layer.

2. The ferroelectric nanoelectromechanical apparatus of claim 1, further comprising:
a second structural beam;
a second input electrode disposed on another first top portion of the second structural beam, wherein the output electrode is positioned between the first input electrode and the second input electrode;
a second ferroelectric film disposed on another second top portion of the second input electrode; and
a second resistive layer disposed on another third top portion of the second ferroelectric film, wherein another first electrode is positioned at another first end of the second resistive layer and another second electrode is positioned at another second end of the second resistive layer.

3. The ferroelectric nanoelectromechanical apparatus of claim 1, wherein ferroelectric domains of the first ferroelectric film are changed by application of voltage between the first input electrode and the first electrode and the second electrode.

4. The ferroelectric nanoelectromechanical apparatus of claim 3, wherein the ferroelectric domains are changed along a length of the first ferroelectric film by the application of a voltage gradient across the first resistive layer.

5. The ferroelectric nanoelectromechanical apparatus of claim 4, wherein a weight is stored in the first ferroelectric film after application of a predetermined voltage gradient across the first ferroelectric film.

6. The ferroelectric nanoelectromechanical apparatus of claim 4, wherein a first voltage is applied to the first input electrode and a second voltage is applied to the first electrode of the first resistive layer, and an output voltage at the output electrode is represented by a multiplication of the first voltage and the second voltage.

7. The ferroelectric nanoelectromechanical apparatus of claim 1, wherein the first ferroelectric film stores values in a mechanical deformation in the first structural beam, and wherein the values depend on voltages at the first input electrode and at the first and second electrodes.

8. The ferroelectric nanoelectromechanical apparatus of claim 2, wherein the first and second ferroelectric films are a scandium (Sc)-aluminum nitride (AlN) (Sc—AlN) ferroelectric film or a hafnium zirconium oxide (HZO) ferroelectric film.

9. The ferroelectric nanoelectromechanical apparatus of claim 8, wherein the first and second ferroelectric films have a thickness between about 1 nm and about 300 nm.

10. The ferroelectric nanoelectromechanical apparatus of claim 2, wherein the first and second structural beams comprise silicon nitride or aluminum nitride.

11. The ferroelectric nanoelectromechanical apparatus of claim 10, wherein the first and second structural beams have lengths between about 200 nm and 50 microns, and wherein the first and second structural beams have widths between 1 micron and 10 microns.

12. The ferroelectric nanoelectromechanical apparatus of claim 1, wherein the ferroelectric apparatus forms a multiply-accumulate (MAC) unit in a deep neural network (DNN) or neuromorphic computation device.

13. A method of multiplying voltages, the method comprising:
receiving a first voltage applied to a first input electrode disposed on a first top portion of a first structural beam, wherein a first ferroelectric film is disposed on a second top portion of the first input electrodes;
receiving a second voltage applied to a first electrode, wherein a first resistive layer is disposed on a third top portion of the first ferroelectric film; and
generating an output voltage at an output electrode represented by a multiplication of the first voltage and the second voltage.

14. The method of claim 13, further comprising:
receiving the first voltage applied to second input electrode disposed on another top portion of a second structural beam, wherein a second ferroelectric film is disposed on second top portion of the second input electrode; and
receiving the second voltage applied to a second electrode, wherein a second resistive layer is disposed on another third top portion of the second ferroelectric film.

15. The method of claim 13, wherein the first ferroelectric film stores a value in a mechanical deformation the first structural beam, and wherein the value depends on voltages at the first input electrode and at the first electrode.

16. The method of claim 14, wherein the first electrode is positioned at a first end of the first resistive layer and the second electrode is positioned at a second end of the first resistive layer.

17. The method of claim 13, wherein ferroelectric domains of the first ferroelectric film are changed by application of voltage between the first input electrode and the first and second electrodes.

18. The method of claim 17, wherein the ferroelectric domains are changed along a length of the first ferroelectric film by the application of a voltage gradient across the first resistive layer.

19. The method of claim 13, wherein a weight is stored in the first ferroelectric film after application of a predetermined voltage gradient across the first ferroelectric film.

20. The method of claim 14, wherein the first and second ferroelectric films are a scandium (Sc)-aluminum nitride (AlN) (Sc—AlN) ferroelectric film or a hafnium zirconium oxide (HZO) ferroelectric film.

21. The method of claim 14, wherein the first and second structural beams comprise silicon nitride or aluminum nitride.

22. The method of claim 13, wherein the apparatus forms a multiply-accumulate (MAC) unit n a deep neural network (DNN) or neuromorphic computation device.

* * * * *